US 11,532,695 B2

(12) United States Patent
Yin et al.

(10) Patent No.: US 11,532,695 B2
(45) Date of Patent: Dec. 20, 2022

(54) STRESS REDUCTION STRUCTURE FOR METAL-INSULATOR-METAL CAPACITORS

(71) Applicant: Taiwan Semiconductor Manufacturing Company, Ltd., Hsinchu (TW)

(72) Inventors: Jin-Mu Yin, Kaohsiung (TW); Hung-Chao Kao, Taipei (TW); Hsiang-Ku Shen, Hsinchu (TW); Dian-Hau Chen, Hsinchu (TW); Yen-Ming Chen, Hsin-Chu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 16/948,527

(22) Filed: Sep. 22, 2020

(65) Prior Publication Data

US 2021/0098564 A1  Apr. 1, 2021

Related U.S. Application Data

(60) Provisional application No. 62/908,427, filed on Sep. 30, 2019.

(51) Int. Cl.
*H01L 23/522* (2006.01)
*H01L 49/02* (2006.01)

(52) U.S. Cl.
CPC .......... *H01L 28/56* (2013.01); *H01L 23/5223* (2013.01)

(58) Field of Classification Search
CPC combination set(s) only.
See application file for complete search history.

(56) References Cited

U.S. PATENT DOCUMENTS

| | | | |
|---|---|---|---|
| 6,934,143 B2 | 8/2005 | Chou et al. | |
| 7,195,970 B2 | 3/2007 | Tu et al. | |
| 7,557,399 B2 | 7/2009 | Tu et al. | |
| 9,269,761 B2 | 2/2016 | Pan et al. | |
| 9,287,350 B2 | 3/2016 | Yang | |

(Continued)

FOREIGN PATENT DOCUMENTS

WO  2017185326 A1  11/2017

OTHER PUBLICATIONS

Matsunaga et al., JP 2004-063667A, 2004.*
Machine Translation of JP 2004-063667A.*

*Primary Examiner* — Suberr L Chi
(74) *Attorney, Agent, or Firm* — Haynes and Boone, LLP

(57) ABSTRACT

A method and semiconductor device including a substrate having one or more semiconductor devices. In some embodiments, the device further includes a first passivation layer disposed over the one or more semiconductor devices. The device may further include a metal-insulator-metal (MIM) capacitor structure formed over the first passivation layer. In addition, the device may further include a second passivation layer disposed over the MIM capacitor structure. In various examples, a stress-reduction feature is embedded within the second passivation layer. In some embodiments, the stress-reduction feature includes a first nitrogen-containing layer, an oxygen-containing layer disposed over the first nitrogen-containing layer, and a second nitrogen-containing layer disposed over the oxygen containing layer.

20 Claims, 21 Drawing Sheets

(56) References Cited

U.S. PATENT DOCUMENTS

| | | | |
|---|---|---|---|
| 9,941,195 B2 | 4/2018 | Liao et al. | |
| 10,553,672 B2 | 2/2020 | Huang et al. | |
| 10,825,765 B2 * | 11/2020 | Wu | H01L 28/40 |
| 2016/0197082 A1 | 7/2016 | Park et al. | |
| 2019/0172826 A1 | 6/2019 | Or-Bach et al. | |
| 2020/0035596 A1 * | 1/2020 | Kao | H01L 25/0657 |
| 2020/0105862 A1 * | 4/2020 | Wu | H01L 23/562 |

* cited by examiner

STRESS REDUCTION STRUCTURE FOR METAL-INSULATOR-METAL CAPACITORS

CROSS-REFERENCE TO RELATED APPLICATION

This application claims the benefit of U.S. Provisional Application No. 62/908,427, filed Sep. 30, 2019, the entirety of which is incorporated by reference herein.

BACKGROUND

The electronics industry has experienced an ever-increasing demand for smaller and faster semiconductor devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

By way of example, and with the continued scaling of IC devices, passive devices requiring large surface areas may be fabricated as part of a back-end-of-line (BEOL) process. One example of a passive device that may be formed as part of a BEOL process is a metal-insulator-metal (MIM) capacitor. In general, a MIM capacitor includes multiple conductor plate layers that are separated from one another by dielectric layers. In some examples, MIM capacitors may be formed over a semiconductor substrate including a device layer (e.g., transistors, etc.) and a multi-layer interconnect (MLI) structure which provides interconnections between various microelectronic components within the substrate. In some embodiments, a passivation layer may be formed over the MIM capacitors, and contact vias may be formed to electrically couple lower contact features to upper contact features, such as contact pads, for connection to external circuitry. The contact pads may also be disposed in regions above the MIM capacitors. In some cases, stress may be induced on the MIM capacitors by surrounding layers and/or features (e.g., such as the passivation layer and the contact pads). As a result, the MIM capacitors may be damaged. In some examples, the induced stress may also form cracks which can propagate to the MIM capacitors, degrading their performance.

Thus, existing techniques have not proved entirely satisfactory in all respects.

BRIEF DESCRIPTION OF THE DRAWINGS

Aspects of the present disclosure are best understood from the following detailed description when they are read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
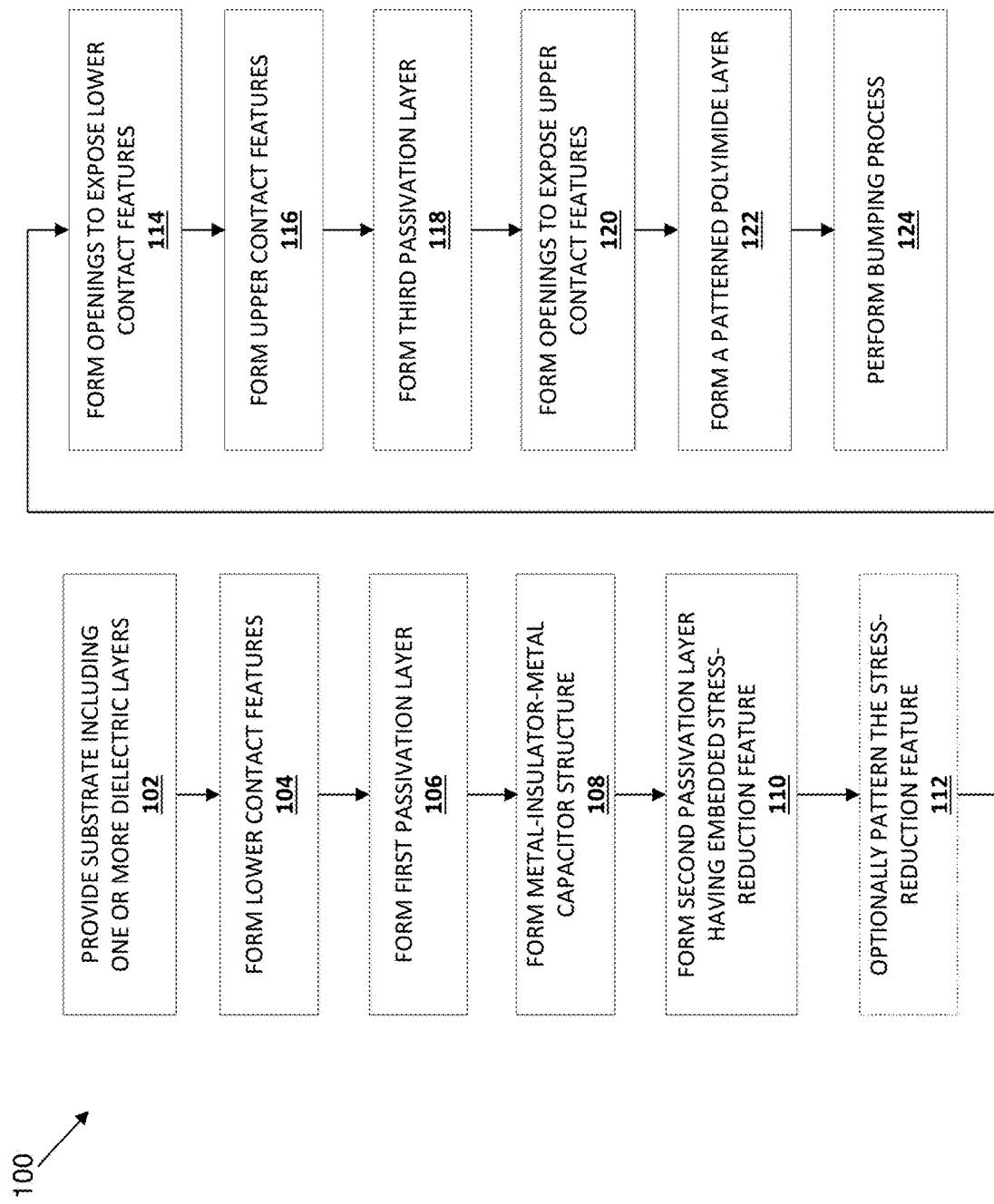
FIG. 1 is a flow chart of a method of forming a semiconductor device including a MIM capacitor, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

Metal-insulator-metal (MIM) capacitors have been widely used in functional circuits such as mixed signal circuits, analog circuits, Radio Frequency (RF) circuits, Dynamic Random-Access Memories (DRAMs), embedded DRAMs, and logic operation circuits. In system-on-chip (SOC) applications, different capacitors for different functional circuits have to be integrated on a same chip to serve different purposes. For example, in mixed-signal circuits, capacitors are used as decoupling capacitors and high-frequency noise filters. For DRAM and embedded DRAM circuits, capacitors are used for memory storage, while for RF circuits, capacitors are used in oscillators and phase-shift networks for coupling and/or bypassing purposes. For microprocessors, capacitors are used for decoupling. As its name suggests, a MIM capacitor includes a sandwich structure of interleaving metal layers and insulator layers. An exemplary MIM capacitor includes a bottom conductor plate layer, a middle conductor plate layer over the bottom conductor plate layer, and a top conductor plate layer over the middle conductor plate, each of which is insulated from an adjacent conductor plate layer by a dielectric layer.

In various embodiments, MIM capacitors may be fabricated as part of a back-end-of-line (BEOL) process. In some examples, MIM capacitors may be formed over a semiconductor substrate including a device layer (e.g., transistors, etc.) and a multi-layer interconnect (MLI) structure which provides interconnections between various microelectronic components within the substrate. In some embodiments, a passivation layer may be formed over the MIM capacitors, and contact vias may be formed to electrically couple lower contact features to upper contact features, such as contact pads, for connection to external circuitry. The contact pads may also be disposed in regions above (or near) the MIM capacitors. In some cases, stress may be induced on the MIM capacitors by surrounding layers and/or features (e.g., such as the passivation layer and the contact pads). As a result, the MIM capacitors may be damaged. In some examples, the induced stress may also form cracks which can propagate to the MIM capacitors, degrading their performance. Thus, existing methods have not been entirely satisfactory in all respects.

Embodiments of the present disclosure offer advantages over the existing art, though it is understood that other embodiments may offer different advantages, not all advantages are necessarily discussed herein, and no particular advantage is required for all embodiments. For example, embodiments discussed herein include methods and structures for releasing stress that would otherwise be induced on MIM capacitors and for preventing stress-induced damage to MIM capacitors. In some embodiments, a stress-reduction feature is embedded within a passivation layer disposed over a MIM capacitor to provide the stress release and thus prevent damage to the MIM capacitor. In some examples, the stress-reduction feature includes a multi-layer structure having an oxygen-containing layer disposed between nitrogen-containing layers. The oxygen-containing layer and/or the nitrogen-containing layers may further include silicon. For instance, in some embodiments, the nitrogen-containing layers may include silicon nitride (SiN). In some cases, the oxygen-containing layer may include silicon oxide (SiOx). Thus, the stress-reduction feature may at times be referred to as a nitrogen-oxygen-nitrogen (NON) multi-layer structure. In various examples, a thickness of each of the nitrogen-containing layers is greater than a thickness of the oxygen-containing layer. In some embodiments, the embedded stress-reduction feature may function as a crack stop, preventing cracks within the passivation layer from propagating to the MIM capacitors, and thus preventing the formation of cracks and/or other defects within conductor plates or dielectric layers of the MIM capacitors. Additional details of embodiments of the present disclosure are provided below, and additional benefits and/or other advantages will become apparent to those skilled in the art having benefit of the present disclosure.

Referring now to FIG. 1, illustrated is a method 100 of forming semiconductor device including a MIM capacitor, in accordance with some embodiments. The method 100 is described below in more detail with reference to FIGS. 2-16, which provide cross-sectional views of a semiconductor device 200 at different stages of fabrication, according to embodiments of the present disclosure. It will be understood that the method 100 is merely an example and is not intended to limit the present disclosure to what is explicitly illustrated in the method 100. Further, additional process steps may be implemented before, during, and after the method 100, and some process steps described may be replaced or eliminated in accordance with various embodiments of the method 100. It is also noted that for clarity of discussion, not all steps are described herein in detail. In addition, parts of the method 100 may be fabricated by a well-known complementary metal-oxide-semiconductor (CMOS) technology process flow, and thus some processes are only briefly described herein.

Figure 2:
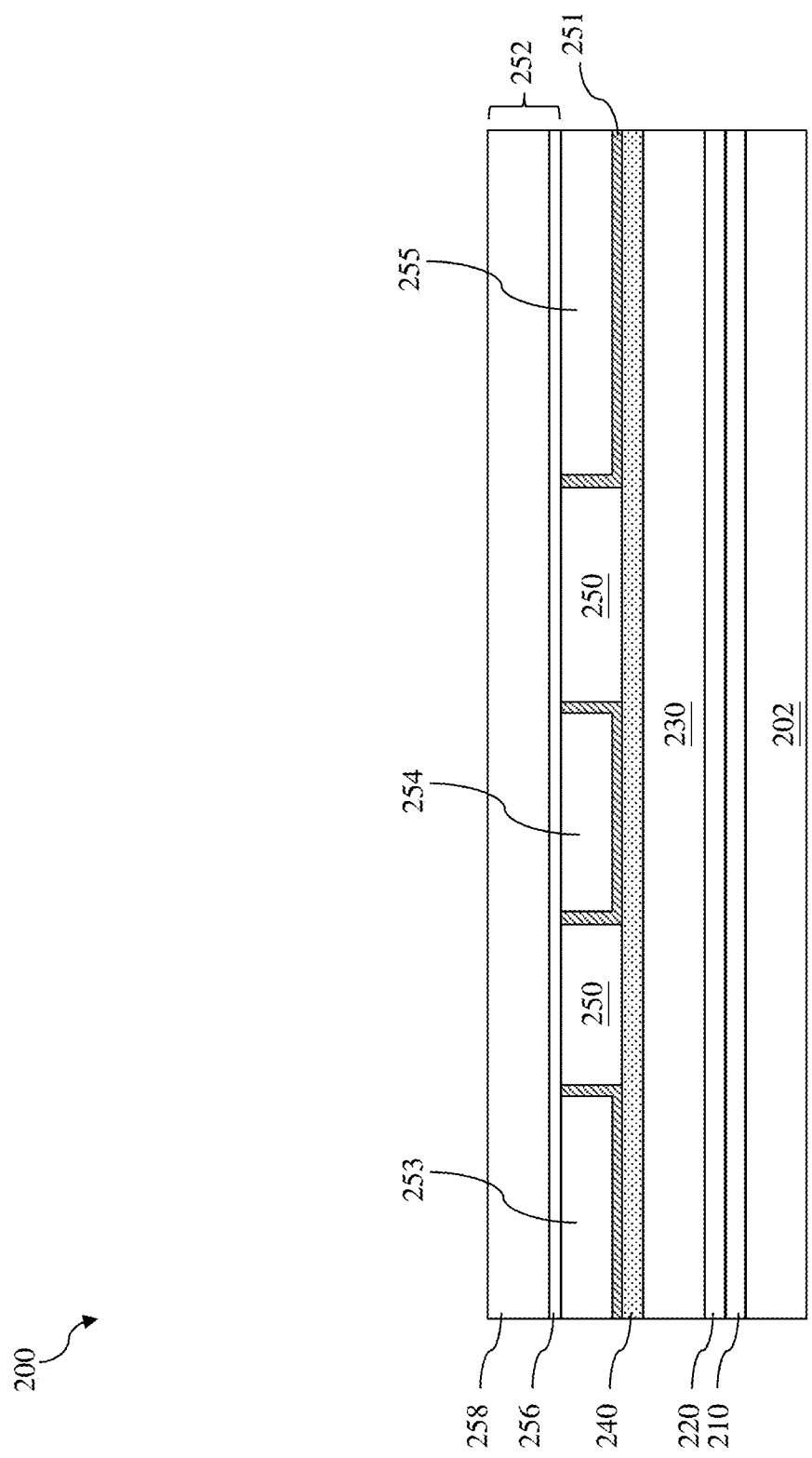
FIGS. 2, 3, 4, 5, 6, 7, 8, 9, 10, 11, 12, 13, 14, 15, and 16 provide cross-sectional views of a device at intermediate stages of fabrication and processed in accordance with the method of FIG. 1, according to some embodiments.

The method 100 begins at block 102 where a substrate including one or more dielectric layers is provided. With reference to FIG. 2, and in an embodiment of block 102, a device 200 including a substrate 202 is provided. The substrate 202 may be a semiconductor substrate such as a silicon substrate. The substrate 202 may include various layers, including conductive or insulating layers formed on the substrate 202. The substrate 202 may include various doping configurations depending on design requirements as is known in the art. The substrate 202 may also include other semiconductors such as germanium, silicon carbide (SiC), silicon germanium (SiGe), or diamond. Alternatively, the substrate 202 may include a compound semiconductor and/or an alloy semiconductor. Further, in some embodiments, the substrate 202 may include an epitaxial layer (epi-layer), the substrate 202 may be strained for performance enhancement, the substrate 202 may include a silicon-on-insulator (SOI) structure, and/or the substrate 202 may have other suitable enhancement features.

In some embodiments, the substrate 202 includes one or more active and/or passive semiconductor devices such as transistors, diodes, optoelectronic devices, resistors, capacitors, sensors, or other devices. In various examples, the transistors may include source/drain features, gate structures, gate spacers, contact features, isolation structures such as shallow trench isolation (STI) structures, or other suitable components. By way of example, the active and/or passive semiconductor devices formed within the substrate 202 may be formed as part of a front-end-of-line (FEOL) process.

In various examples, the substrate 202 may also include an interconnect structure such as a multi-layer interconnect (MLI) structure, which may include multiple patterned dielectric layers and conductive layers that provide interconnections (e.g., wiring) between the various microelectronic components formed within the substrate 202. By way of example, the MLI structure, as well as other layers, features, components, or devices formed over the MLI structure may be formed as part of a BEOL process. In addition, and in at least some cases, one or more of the dielectric layers and/or conductive layers of the MLI structure may be formed over the substrate 202. As noted, the interconnect structure may include a plurality of conductive features and a plurality of dielectric features used to provide isolation between the conductive features. In some embodiments, the conductive features may include contacts, vias, or metal lines to provide horizontal and vertical interconnections. In some cases, the metal lines may include copper (Cu), aluminum (Al), an aluminum copper (AlCu) alloy, ruthenium (Ru), cobalt (Co), or other appropriate metal layer. In some examples, the contacts and/or vias may include Cu, Al, an AlCu alloy, Ru, Co, tungsten (W), or other appropriate metal layer. In some embodiments, the dielectric features of the MLI structure may include silicon oxide or a silicon oxide containing material where silicon exists in various suitable forms. In some examples, the dielectric features may include a low-K dielectric layer (e.g., having a dielectric constant less than that of $SiO_2$ which is about 3.9) such as tetraethylorthosilicate (TEOS) oxide, undoped silicate glass (USG), or doped silicon oxide such as borophosphosilicate glass (BPSG), fluorosilicate glass (FSG), phosphosilicate glass (PSG), boron doped silicon glass (BSG), and/or other suitable low-K dielectric material.

In some embodiments, and in a further embodiment of block 102, an interlayer dielectric (ILD) 210 is formed over the substrate 202. The ILD 210 may include silicon oxide, a silicon oxide containing material, or a low-K dielectric layer such as TEOS oxide, undoped silicate glass (USG), or doped silicon oxide such as BPSG, FSG, PSG, BSG, and/or other suitable low-K dielectric material. In various examples, the ILD 210 may be deposited by chemical vapor deposition (CVD), physical vapor deposition (PVD), atomic layer deposition (ALD), or combinations thereof. As one example, the ILD 210 may have a thickness of about 200 nm. In other embodiments, the ILD 210 may have a thickness of between about 150 nm and about 250 nm. The ILD 210 may be conformally deposited and have a substantially uniform thickness.

In some examples, and in a further embodiment of block 102, a carbide layer 220 is formed over the ILD 210. In some embodiments, the carbide layer 220 may be deposited by CVD, PVD, ALD, or combinations thereof. In some embodiments, the carbide layer 220 may include a silicon carbide (SiC) layer, although other types of carbide materials may be used. In some examples, the carbide layer 220 may have a thickness of about 55 nm. In other embodiments, the carbide layer 220 may have a thickness of between about 45 nm and about 65 nm. The carbide layer 220, in some embodiments, may be conformally deposited and have a substantially uniform thickness.

Still referring to FIG. 2, and in a further embodiment of block 102, the device 200 further includes a dielectric layer 230 formed over the carbide layer 220. In some embodiments, the dielectric layer 230 may include silicon oxide or a silicon oxide containing material. In some cases, the dielectric layer 230 may include undoped silicate glass (USG). In various examples, the dielectric layer 230 may be deposited by plasma enhanced CVD (PECVD), high-density plasma CVD (HDP-CVD), sub-atmospheric CVD (SACVD), ALD, PVD, or a combination thereof. In some cases, the dielectric layer 230 may have a thickness of about 620 nm. In other embodiments, the dielectric layer 230 may have a thickness of between about 575 nm and about 675 nm. In some embodiments, the dielectric layer 230 may be conformally deposited and have a substantially uniform thickness.

In some embodiments, and in a further embodiment of block 102, a dielectric layer 240 may be formed over the dielectric layer 230. In some cases, the dielectric layer 240 may include a nitrogen-containing material and/or a carbon-containing material. For example, the dielectric layer 240 may include silicon carbon nitride (SiCN), silicon oxycarbide (SiOC), silicon carbide (SiC), silicon oxycarbonitride (SiOCN), silicon nitride (SiN), or combinations thereof. In some embodiments, the dielectric layer 240 may have a thickness of about 50 nm. In other embodiments, the dielectric layer 240 may have a thickness of between about 45 nm and about 55 nm. In various examples, the dielectric layer 240 may be deposited by CVD, ALD, PVD, or combinations thereof. The dielectric layer 240 may, in some cases, function as an etch stop layer (ESL).

The method 100 proceeds to block 104 where lower contact features are formed. Still with reference to FIG. 2, and in an embodiment of block 104, a dielectric layer 250 may be deposited over the dielectric layer 240. In some embodiments, the dielectric layer 250 includes silicon oxide or a silicon oxide containing material. In some cases, the dielectric layer 250 may include undoped silicate glass (USG). In various examples, the dielectric layer 230 may be deposited by PECVD, HDP-CVD, SACVD, ALD, PVD, or a combination thereof. In some cases, the dielectric layer 250 may have a thickness of about 900 nm. In other embodiments, the dielectric layer 250 may have a thickness of between about 800 nm and about 1000 nm. In some embodiments, the dielectric layer 250 may be conformally deposited and have a substantially uniform thickness.

After deposition of the dielectric layer 250, and in a further embodiment of block 104, the dielectric layer 250 may be patterned to form trenches. In various examples, the dielectric layer 250 may be patterned using a suitable combination of photolithography processes (e.g., such as photoresist deposition, exposure, and development) to form an etch mask, and an etching process may be performed using the etch mask to form the trenches. In some cases, a hard mask layer (e.g., such as a nitride-containing layer) may be used as part of the patterning process of the dielectric layer 250.

In some embodiments, and in a further embodiment of block 104, lower contact features 253, 254, 255 are formed in the trenches provided by the patterning of the dielectric layer 250. Although the lower contact features 253, 254, 255 are disposed below upper contact features (discussed below), the lower contact features 253, 254, 255 are sometimes referred to as top metal (TM) contacts because they represent a top metal layer of the MLI structure, previously discussed. In some embodiments, each of the lower contact features 253, 254, 255 may include a barrier layer 251 and a metal fill layer to complete the lower contact features 253, 254, 255. By way of example, formation of the lower contact features 253, 254, 255 includes multiple processes. In some embodiments, the barrier layer 251 is formed in each of the trenches provided by the patterning of the dielectric layer 250, followed by the deposition of a metal fill layer over the barrier layer 251. In some embodiments, the barrier layer 251 includes titanium nitride, tantalum, tantalum nitride, or combinations thereof. In some embodiments, the metal fill layer includes a metal or metal alloy such as copper, cobalt, nickel, aluminum, tungsten, titanium, or combinations thereof. In some embodiments, the metal fill layer is formed by deposition or plating, followed by a chemical mechanical planarization (CMP) process.

After forming the lower contact features 253, 254, 255, the method 100 proceeds to block 106 where a first passivation layer is formed. As shown in FIG. 2, and in an embodiment of block 106, a first passivation layer 252 is formed over device 200 including over the lower contact features 253, 254, 255. In some embodiments, the first passivation layer 252 includes a dielectric layer 256 formed over the lower contact features 253, 254, 255. In some embodiments, the dielectric layer 256 is about 75 nm thick. In other embodiments, the dielectric layer 256 may have a thickness of between about 65 nm and about 85 nm. The dielectric layer 256 may include a nitrogen-containing material and/or a carbon-containing material. For example, the dielectric layer 256 may include SiCN, SiOC, SiC, SiOCN, SiN, or combinations thereof. In various examples, the dielectric layer 256 may be deposited by CVD, ALD, PVD, or combinations thereof. In some embodiments, the dielectric layer 256 may protect the lower contact features 253, 254, 255 from being oxidized.

The first passivation layer 252 may further include a dielectric layer 258 formed over the dielectric layer 256. In some embodiments, the dielectric layer 258 may include silicon oxide or a silicon oxide containing material. In some cases, the dielectric layer 258 may include undoped silicate glass (USG). The dielectric layer 258 may be deposited by PECVD, HDP-CVD, SACVD, ALD, PVD, or a combination thereof. Thus, in some cases, the dielectric layer 258 may be referred to as a plasma-enhanced oxide (PEOX). In some cases, the dielectric layer 258 may have a thickness of about 300 nm. In other embodiments, the dielectric layer 258 may have a thickness of between about 250 nm and about 350 nm.

Figure 3:
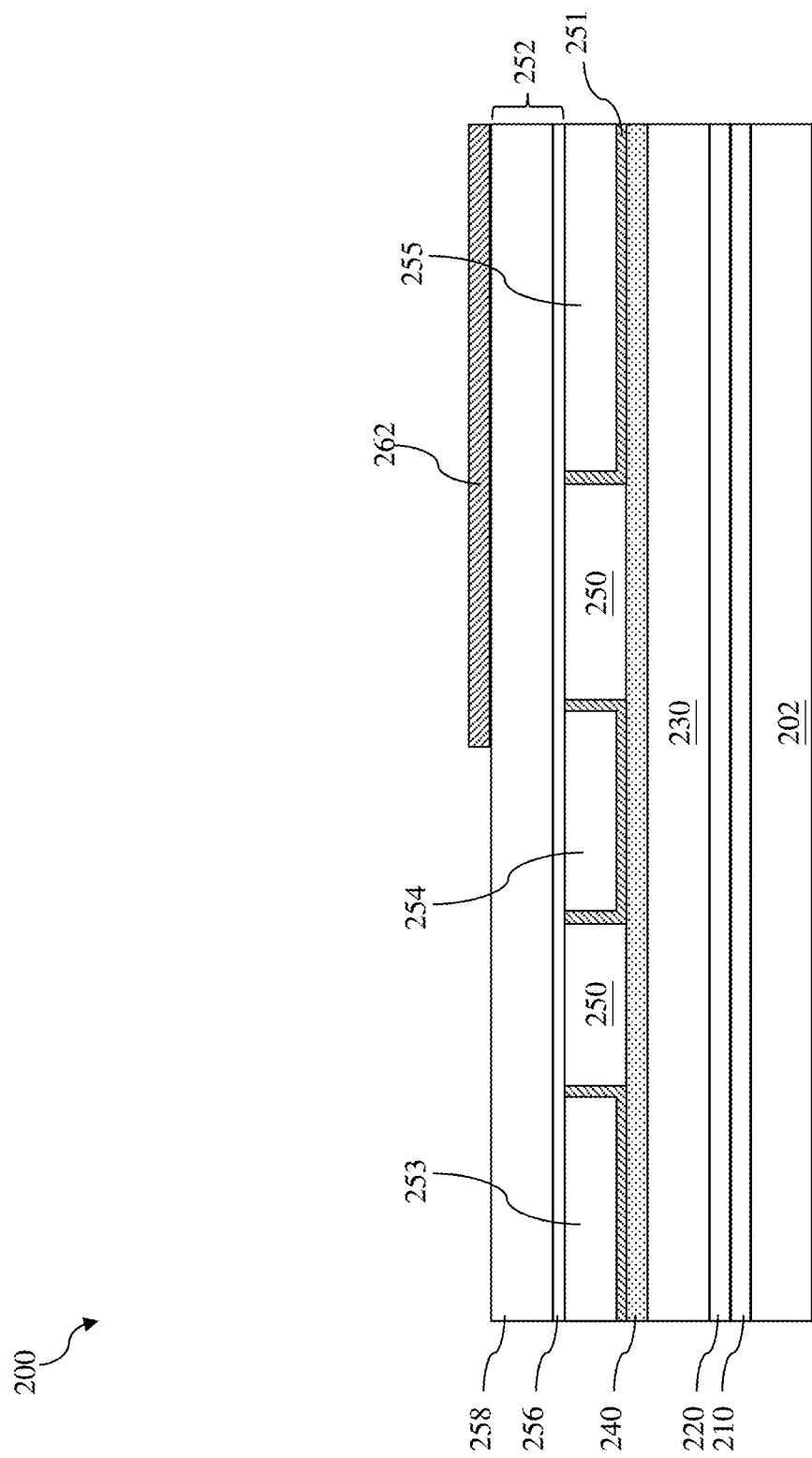
Figure 4:
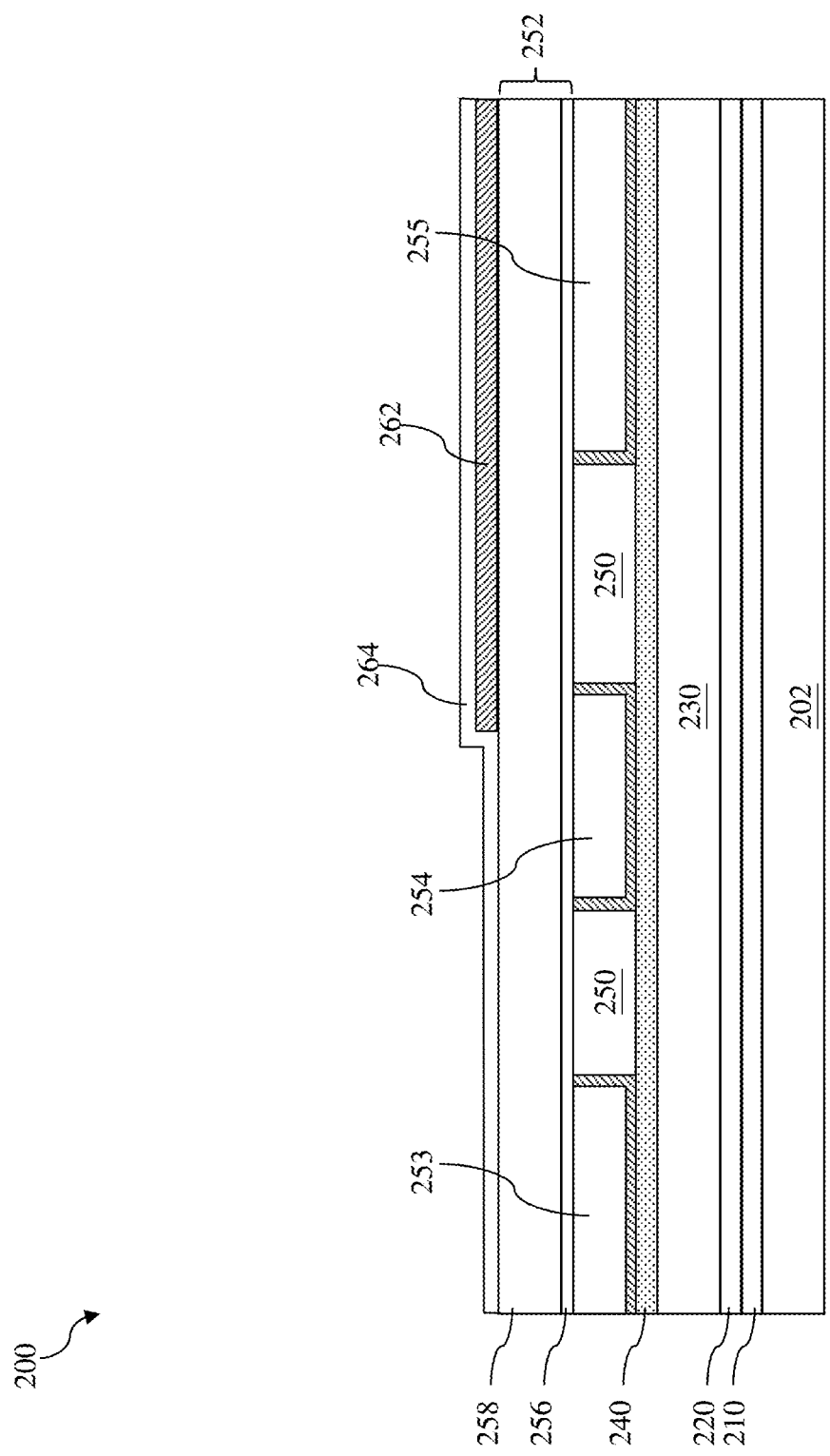
Figure 5:
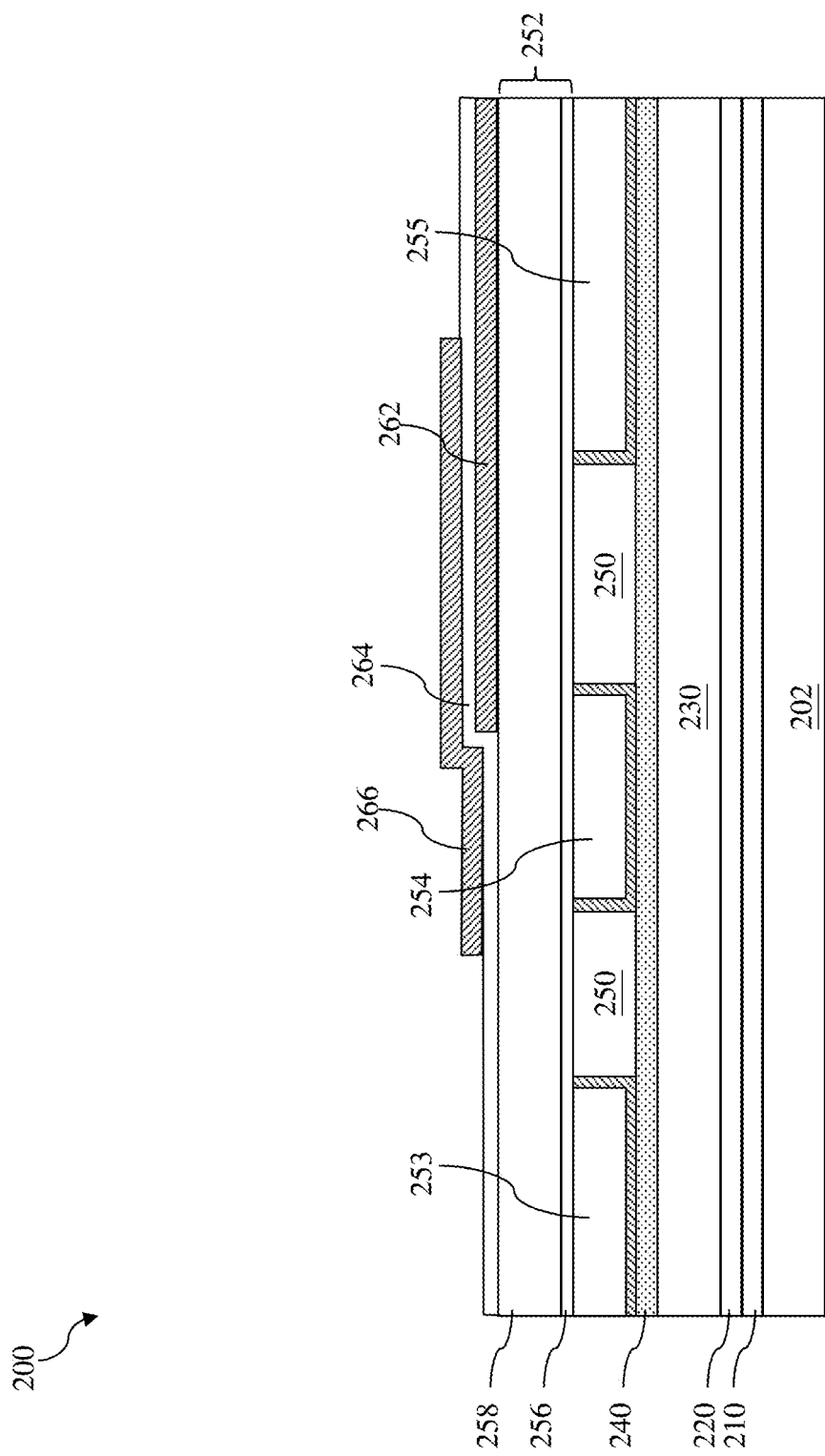
Figure 6:
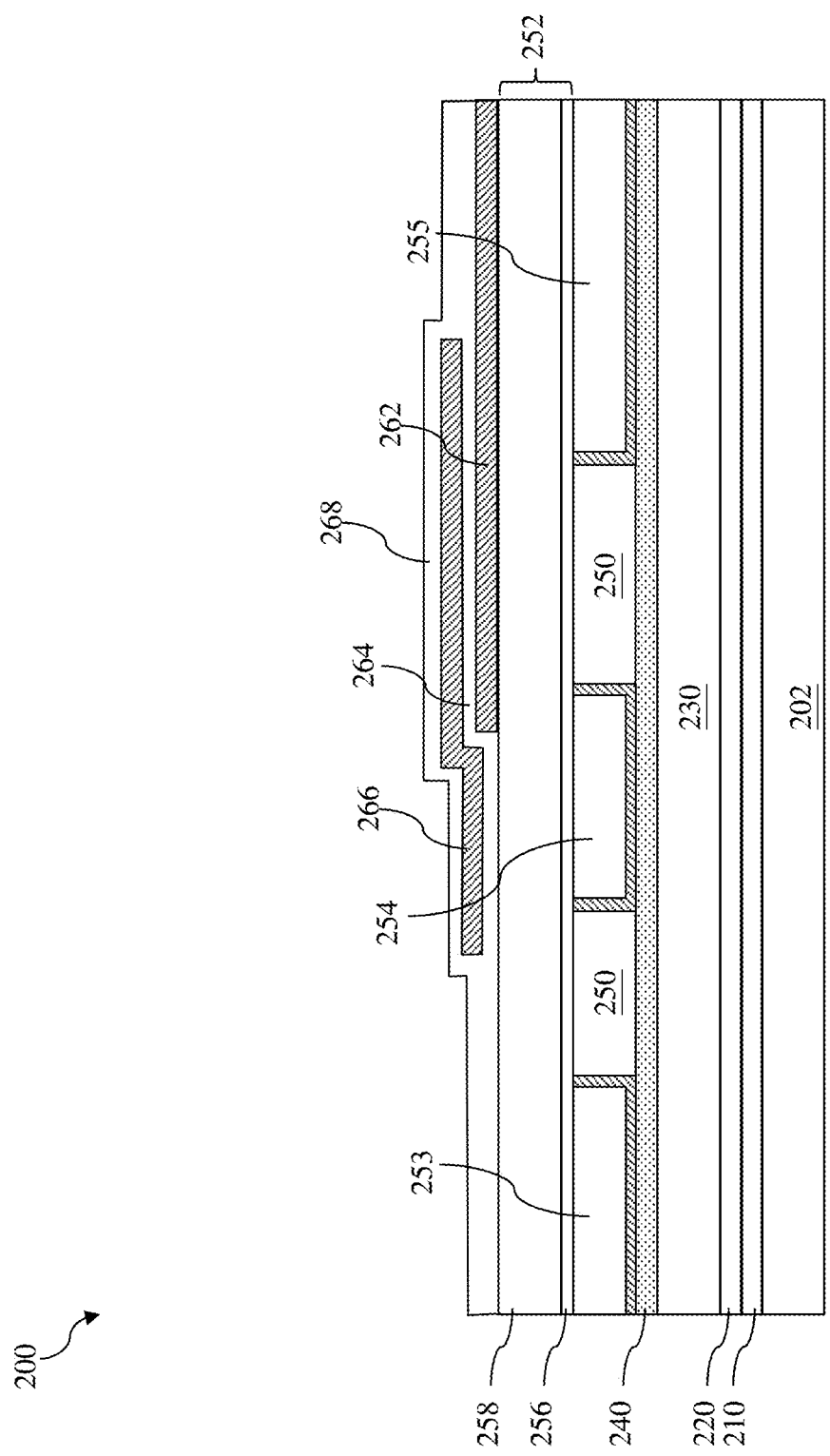
Figure 7:
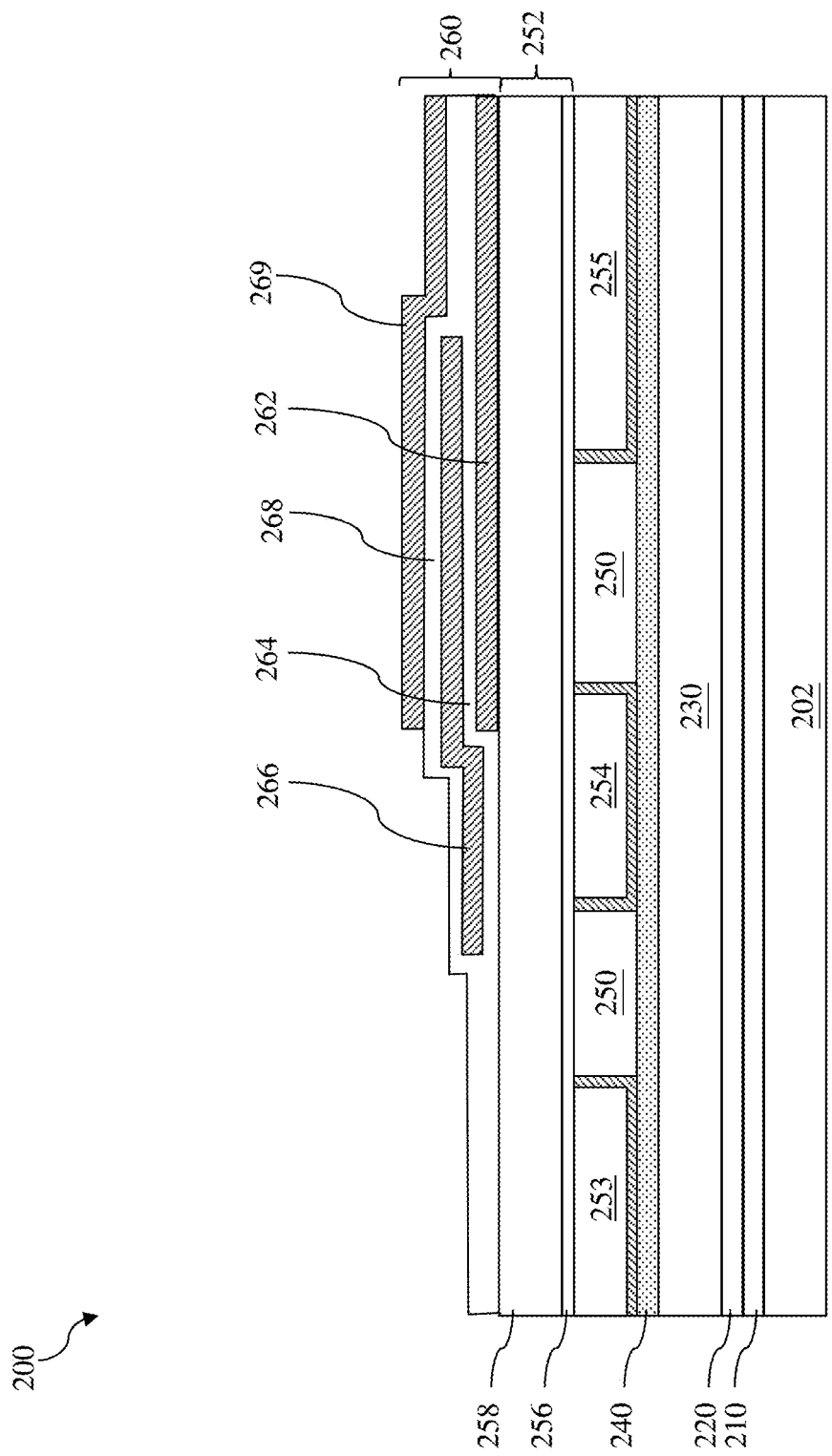

The method 100 then proceeds to block 108 where a metal-insulator-metal (MIM) capacitor structure is formed. As discussed below, fabrication of a MIM capacitor structure involves multiple processes such as deposition and patterning of a bottom conductor plate layer, a middle conductor plate layer, and a top conductor plate layer, as well as formation of insulators between adjacent conductor plates of the MIM capacitor. With reference first to FIG. 3, and in an embodiment of block 108, a patterned bottom conductor plate layer 262 is formed over the dielectric layer 258. By way of example, formation of the patterned bottom conductor plate layer 262 may involve multiple processes such as layer deposition, photolithography, development, and/or etching, etc. In an embodiment, the bottom conductor plate layer 262 may include a metal nitride layer such as titanium nitride (TiN), however other metals may likewise be used. The bottom conductor plate layer 262 may go through surface treatment such as sidewall passivation using a nitrous oxide ($N_2O$) gas. In some embodiments, the bottom conductor plate layer 262 is about 40 nm thick. In other embodiments, the bottom conductor plate layer 262 may have a thickness of between about 35 nm and about 45 nm. As shown in FIG. 4, an insulator layer 264 is formed over the device 200 including over the bottom conductor plate layer 262. In an embodiment, the insulator layer 264 is conformally deposited and has a generally uniform thickness over the top surface of the device 200 (e.g., having about the same thickness on top and sidewall surfaces of the bottom conductor plate layer 262). As shown in FIG. 5, a patterned middle conductor plate layer 266 is formed over the device 200 including over the insulator layer 264. The middle conductor plate layer 266 may be formed in a way similar to that used to form the bottom conductor plate layer 262, but the pattern of the middle conductor plate layer 266 may be different from that of the bottom conductor plate layer 262. In an embodiment, the middle conductor plate layer 266 may include a metal nitride layer such as TiN, however other metals may be used. In some embodiments, the middle conductor plate layer 266 is about 40 nm thick. In other embodiments, the middle conductor plate layer 266 may have a thickness of between about 35 nm and about 45 nm. As shown in FIG. 6, an insulator layer 268 is formed over the device 200 including over the middle conductor plate layer 266. In an embodiment, the insulator layer 268 is conformally deposited and has a generally uniform thickness over the top surface of the device 200 (e.g., having about the same thickness on top and sidewall surfaces of the middle conductor plate layer 266). As shown in FIG. 7, a patterned top conductor plate layer 269 is formed over the device 200 including over the insulator layer 268. The top conductor plate layer 269 may be formed in a way similar to that used to form the middle conductor plate layer 266 or the bottom conductor plate layer 262, but the pattern of the top conductor plate layer 269 may be different from that of the middle conductor plate layer 266 or the bottom conductor plate layer 262. In an embodiment, the top conductor plate layer 269 may include a metal nitride layer such as titanium nitride (TiN), however other metals may be used. In some embodiments, the top conductor plate layer 269 is about 40 nm thick. In other embodiments, the top conductor plate layer 269 may have a thickness of between about 35 nm and about 45 nm.

Thus, as shown in FIG. 7, and in an embodiment of block 108, a MIM structure 260 has been formed and includes multiple metal layers including the bottom conductor plate layer 262, the middle conductor plate layer 266, and the top conductor plate layer 269, which function as metal plates of capacitors. The MIM structure 260 also includes multiple insulator layers including the insulator layer 264 disposed between the bottom conductor plate layer 262 and the middle conductor plate layer 266, as well as the insulator layer 268 disposed between the middle conductor plate layer 266 and the top conductor plate layer 269. By way of example, the MIM structure 260 may be used to implement one or more capacitors, which may be connected to other microelectronic components (e.g., including active and/or passive devices, described above). In addition, and in some embodiments, the multi-layer MIM structure 260 allows capacitors to be closely packed together in both vertical and lateral directions, thereby reducing an amount of lateral space needed for implementing capacitors. As a result, the MIM structure 260 may accommodate super high-density capacitors.

In some embodiments, and to increase capacitance values, the insulator layer 264 and/or the insulator layer 268 may include high-k dielectric material(s) having a dielectric constant (k-value) larger than that of silicon oxide. In various examples, the insulator layers 264, 268 may be relatively thin to further provide increased capacitance values, while maintaining sufficient thicknesses to avoid potential dielectric breakdown of the capacitors in the MIM structure 260 (e.g., when two capacitor plates have high potential difference, current may leak between the plates, causing breakdown). In some embodiments, each of the insulator layers 264, 268 is about 6 nm thick. In other embodiments, each of the insulator layers 264, 268 is about 5 nm to about 7 nm thick. Further, to optimize the capacitor performance, in some embodiments, the insulator layer 264 (or the insulator layer 268) may include a tri-layer structure including, from bottom to top, a first zirconium oxide ($ZrO_2$) layer, an aluminum oxide ($Al_2O_3$) layer, and a second zirconium oxide ($ZrO_2$) layer, where each of the layers is about 1.5 nm to about 2.5 nm thick.

Figure 8:
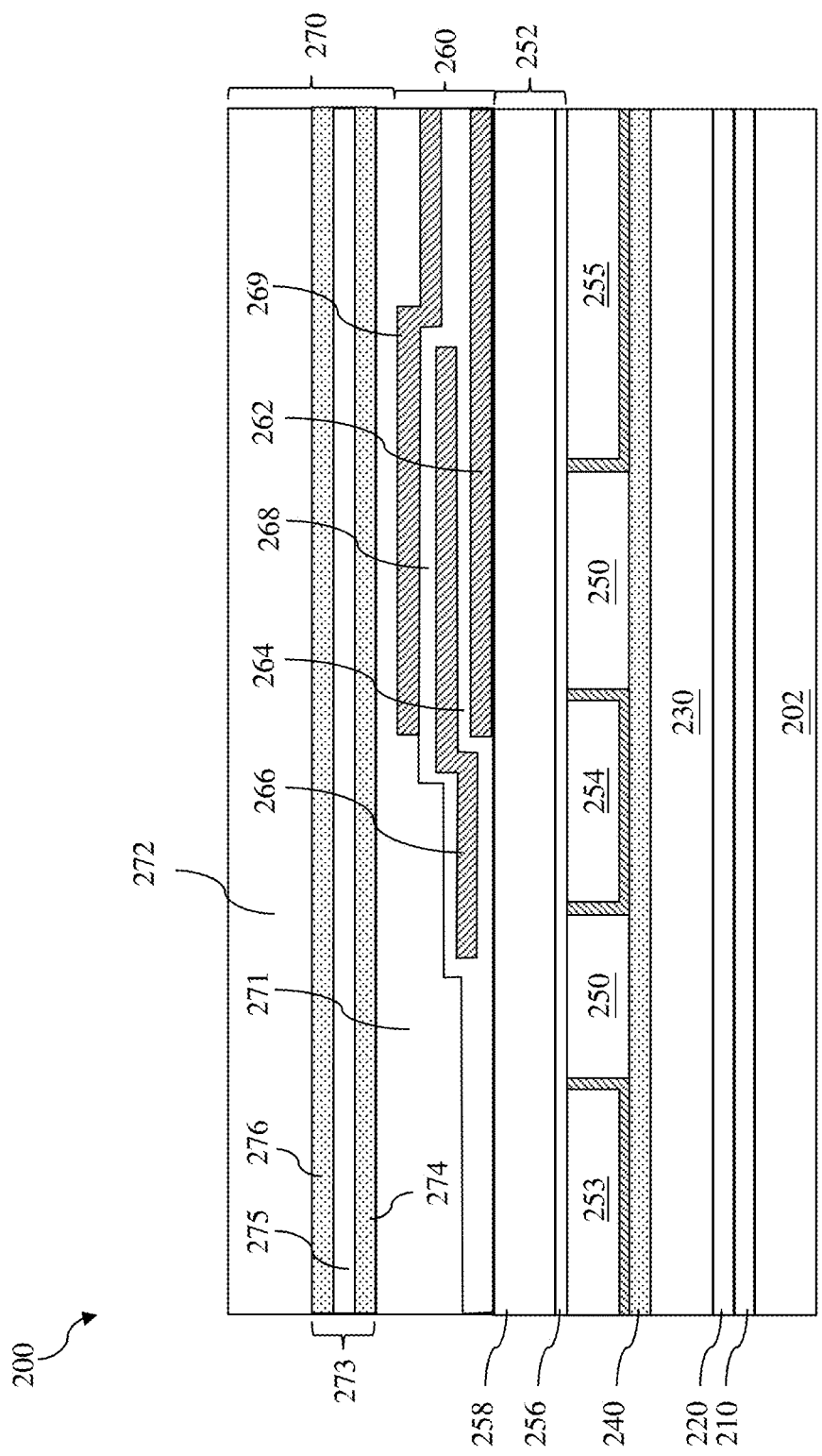

The method 100 proceeds to block 110 where a second passivation layer having an embedded stress-reduction feature is formed. As shown in FIG. 8, and in an embodiment of block 110, a second passivation layer 270 is formed over device 200 including over the MIM structure 260. The second passivation layer 270 includes a first dielectric portion 271, a second dielectric portion 272, and a stress-reduction feature 273 embedded within the second passivation layer 270 between the first dielectric portion 271 and the second dielectric portion 272. According to various embodiments disclosed herein, the stress-reduction feature 273 prevents stress-related damage to the MIM structure 260.

In some embodiments, formation of the second passivation layer 270 begins with formation of the first dielectric portion 271 over the MIM structure 260. The first dielectric portion 271 may include a dielectric layer such as silicon oxide or a silicon oxide containing material. In some cases, the first dielectric portion 271 may include undoped silicate glass (USG). The first dielectric portion 271 may be deposited by PECVD, HDP-CVD, SACVD, ALD, PVD, or a combination thereof. Thus, in some cases, the first dielectric portion 271 may be referred to as a plasma-enhanced oxide (PEOX). In some cases, the first dielectric portion 271 may have a thickness of between about 100 nm-150 nm. As shown in FIG. 8, the MIM structure 260 is disposed between the dielectric layer 258 and the first dielectric portion 271, which may include substantially the same material, in some embodiments. In some cases, and if the MIM structure 260 is not present, the dielectric layer 258 and the first dielectric portion 271 may be combined as a single dielectric layer over the dielectric layer 256.

The formation of the second passivation layer 270 continues with formation of the stress-reduction feature 273 over the first dielectric portion 271. In some embodiments, the stress-reduction feature 273 includes a multi-layer structure having an oxygen-containing layer 275 disposed between nitrogen-containing layers 274, 276. By way of example, the nitrogen-containing layer 274 is formed over the first dielectric portion 271, the oxygen-containing layer 275 is formed over the nitrogen-containing layer 274, and the nitrogen-containing layer 276 is formed over the oxygen-containing layer 275. The oxygen-containing layer 275 and/or the nitrogen-containing layers 274, 276 may further include silicon, in some embodiments. For instance, the nitrogen-containing layers 274, 276 may include silicon nitride (SiN). In some cases, the oxygen-containing layer 275 may include silicon oxide (SiOx). Thus, the stress-reduction feature 273 may be equivalently referred to as a nitrogen-oxygen-nitrogen (NON) multi-layer structure. In various examples, a thickness of each of the nitrogen-containing layers 274, 276 is greater than a thickness of the oxygen-containing layer 275. As an example, a ratio of the thickness of a nitrogen-containing layer (e.g., the nitrogen-containing layer 274 or the nitrogen-containing layer 276) to the thickness of the oxygen-containing layer 275 may be in a range between about 2:1 and about 3:1. Thus, in some embodiments, a ratio of layer thicknesses of the nitrogen-oxygen-nitrogen (NON) multi-layer structure may be in a range between about 2:1:2 and about 3:1:3. In some embodiments, each of the nitrogen-containing layers 274, 276 is about 100-130 nm thick. It is noted that in some embodiments, each of the nitrogen-containing layers 274, 276 may have substantially the same thickness. However, in some cases, the thickness of the nitrogen-containing layer 274 may be between about 0%-10% greater than the thickness of the nitrogen-containing layer 276. Alternatively, in some examples, the thickness of the nitrogen-containing layer 274 may be between about 0%-10% less than the thickness of the nitrogen-containing layer 276. In some examples, the oxygen-containing layer 275 is about 50-80 nm thick. Each of the nitrogen-containing layers 274, 276 and the oxygen-containing layer 275 may be deposited by CVD, ALD, PVD, or a combination thereof.

In some embodiments, and as discussed in more detail below, the stress-reduction feature 273 provides release of stress induced by surrounding layers and may also function as a crack stop, preventing cracks within adjacent layers from propagating to the MIM structure 260. As such the stress-reduction feature 273 may prevent the formation of cracks and/or other defects within metal plates of the MIM structure 260 (e.g., the bottom conductor plate layer 262, the middle conductor plate layer 266, and the top conductor plate layer 269), as well as within insulator layers of the MIM structure 260 (e.g., the insulator layer 264 and the insulator layer 268). In various examples, the stress-reduction feature 273 may have a greater mechanical strength, and thus a greater Young's modulus, than one or more of the surrounding layers and/or features (e.g., such as the first dielectric portion 271, the second dielectric portion 272, or other layers and/or features disposed above the stress-reduction feature 273).

By way of example, the particular thicknesses of each layer of the NON multi-layer structure, including the particular thickness ratio between the layers, are chosen so that the stress-reduction feature 273 can effectively release the stress induced by the surrounding layers. In some cases, the layer thicknesses of the stress-reduction feature 273 may also be thick enough to stop cracks or other defect from propagating to the underlying MIM structure 260. In some embodiments, the effectiveness of the stress-reduction feature 273 having the particular layer thicknesses and thickness ratios may be pre-determined by simulation (e.g., such as using a technology computer-aided design (TCAD) simulation). In some examples, if the layers of the NON multi-layer structure are too thin, or if the thickness ratios between the layers is significantly different than the examples given above (e.g., such as all layer thicknesses being the same or the thickness of the oxygen-containing layer 275 being greater than the thickness of the nitrogen-containing layers 274, 276), then the stress-reduction feature 273 may not adequately prevent stress, cracks, or other defects from forming in the MIM structure 260 and/or otherwise degrading the MIM structure 260.

In various examples, formation of the second passivation layer 270 continues with formation of the second dielectric portion 272 over the stress-reduction feature 273. As such, the second dielectric portion 272 may be formed directly on the nitrogen-containing layer 276. In some examples, the second dielectric portion 272 may include substantially the same material, and be deposited in substantially the same manner as, the first dielectric portion 271. Thus, the second dielectric portion 272 may include a dielectric layer such as silicon oxide or a silicon oxide containing material. The second dielectric portion 272 may likewise include undoped silicate glass (USG). In some cases, the second dielectric portion 272 may have a thickness of between about 300-400 nm. As shown in FIG. 8, the stress-reduction feature 273 is disposed between the first dielectric portion 271 and the second dielectric portion 272. Thus, the stress-reduction feature 273 may be said to be embedded within the second passivation layer 270. If not for the presence of the stress-reduction feature 273, the first dielectric portion 271 and the second dielectric portion 272 may have been combined as a single dielectric layer over MIM structure 260. Thus, in some examples, deposition of the first dielectric portion 271 may be referred to as partial dielectric layer deposition, with the second dielectric portion 272 completing the dielectric layer deposition for the second passivation layer 270. In addition, to minimize potential stress induced on the MIM structure 260 by the passivation layer 270 (e.g., by the first and second dielectric portions 271, 272), the thickness of the second dielectric portion 272 may generally be greater than the thickness of the first dielectric portion 271. As such, stress induced by the thicker second dielectric portion 272, which is disposed above the stress-reduction feature 273, may be released by the stress-reduction feature 273 rather than being induced on the MIM structure 260. Additionally, cracks and/or other defects originating within, or propagating through, the second dielectric portion 272, will be stopped by the embedded stress-reduction feature 273 instead of propagating to the MIM structure 260, thereby preventing the formation of cracks and/or other defects within the MIM structure 260.

Figure 9:
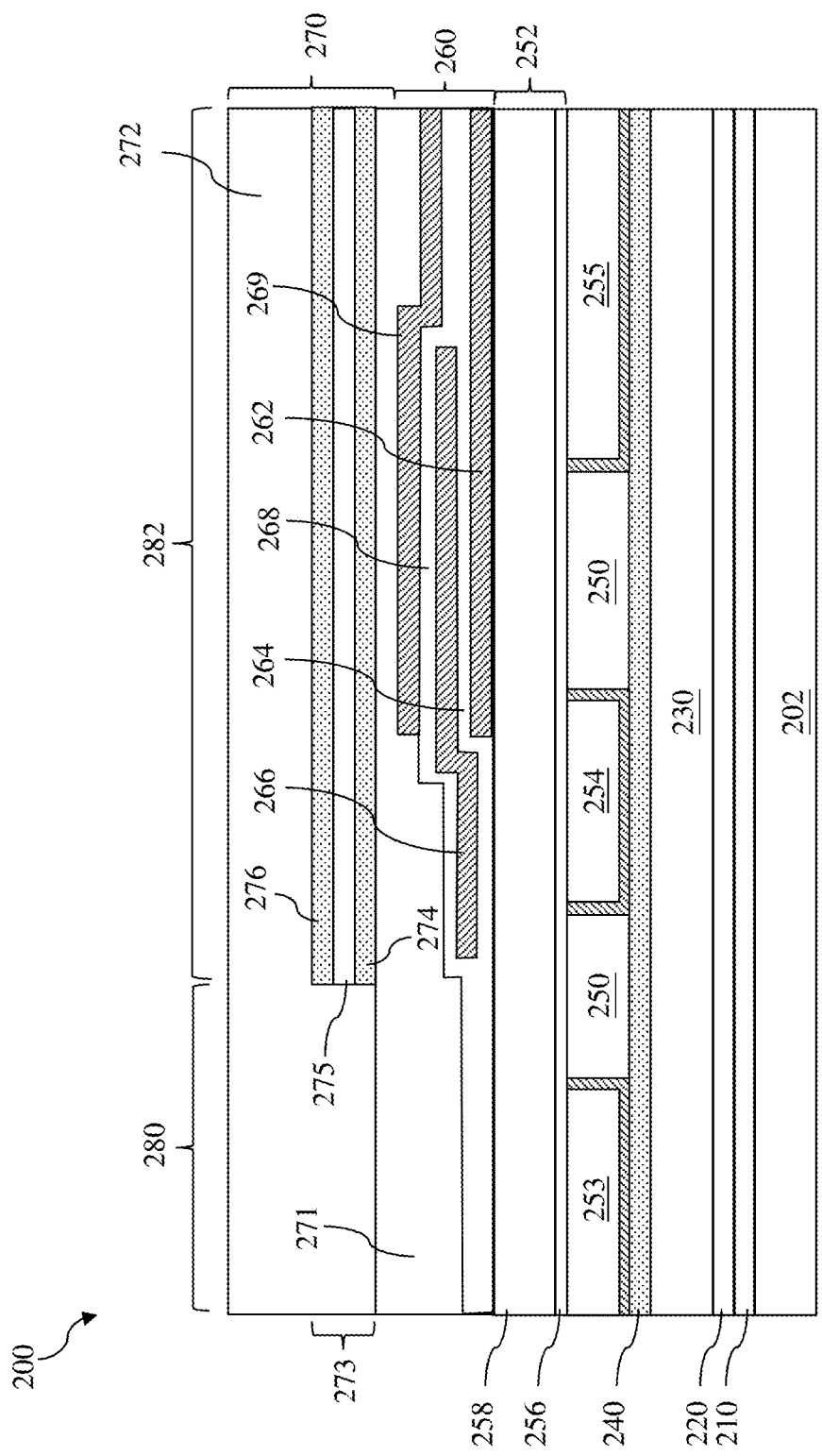

At block 112 of the method 100, the stress-reduction feature may be optionally patterned. For example, with reference to FIG. 9 and in an embodiment of block 112, the stress-reduction feature 273 may be optionally patterned prior to the formation of the second dielectric portion 272. For example, in some cases and before forming the second dielectric portion 272, the stress-reduction feature 273 may be patterned using a suitable combination of photolithography processes (e.g., such as photoresist deposition, exposure, and development) to form an etch mask, and an etching process may be performed using the etch mask to remove at least a portion of the stress-reduction feature 273 in a region 280 of the device 200, as shown in FIG. 9, while another portion of the stress-reduction feature 273 remains within a region 282 of the device 200. It is noted that the region 282 is a region including the MIM structure 260, while the region 280 is a region not including the MIM structure 260. Thus, in some embodiments, the patterning of the stress-reduction feature 273 may be performed to provide the stress-reduction in regions including a MIM structure, while removing the stress-reduction feature 273 from other regions not including a MIM structure. In some cases, a hard mask layer (e.g., such as a nitride-containing layer) may be used as part of the patterning process of the stress-reduction feature 273. After patterning of the stress-reduction feature 273, the second dielectric portion 272 may be formed over the device 200, as discussed above. However, in the example of FIG. 9, the second dielectric portion 272 may be formed on the first dielectric portion 271 within the region 280, and the second dielectric portion 272 may be formed on the stress-reduction feature 273 within the region 282.

In various examples, to provide full protection to the MIM structure 260 and in some embodiments, an area of the device 200 within which the stress-reduction feature 273 is formed may be substantially equal to at least an area occupied by the MIM structure 260, such that the stress-reduction feature 273 fully covers the MIM structure 260. Of course, the stress-reduction feature 273 may cover an area greater than the area where the MIM structure 260 is formed, so long as the entire MIM structure 260 remains substantially covered by the stress-reduction feature 273. To be sure, in at least some cases, an area of the device 200 within which the stress-reduction feature 273 is formed may be less than the area occupied by the MIM structure 260, such that the stress-reduction feature 273 covers an area smaller than the area where the MIM structure 260 is formed. For example, a particular portion of the MIM structure 260 may be identified as being particularly susceptible to stress, cracks, or other defects, and the stress-reduction feature 273 may thus be formed to at least cover the particularly susceptible portion of the MIM structure 260. It is noted that generally, without the use of the stress-reduction feature 273, the MIM structure 260 may be damaged by stress or cracks (e.g., which propagate from nearby passivation layers), resulting in low device yield.

Figure 19:
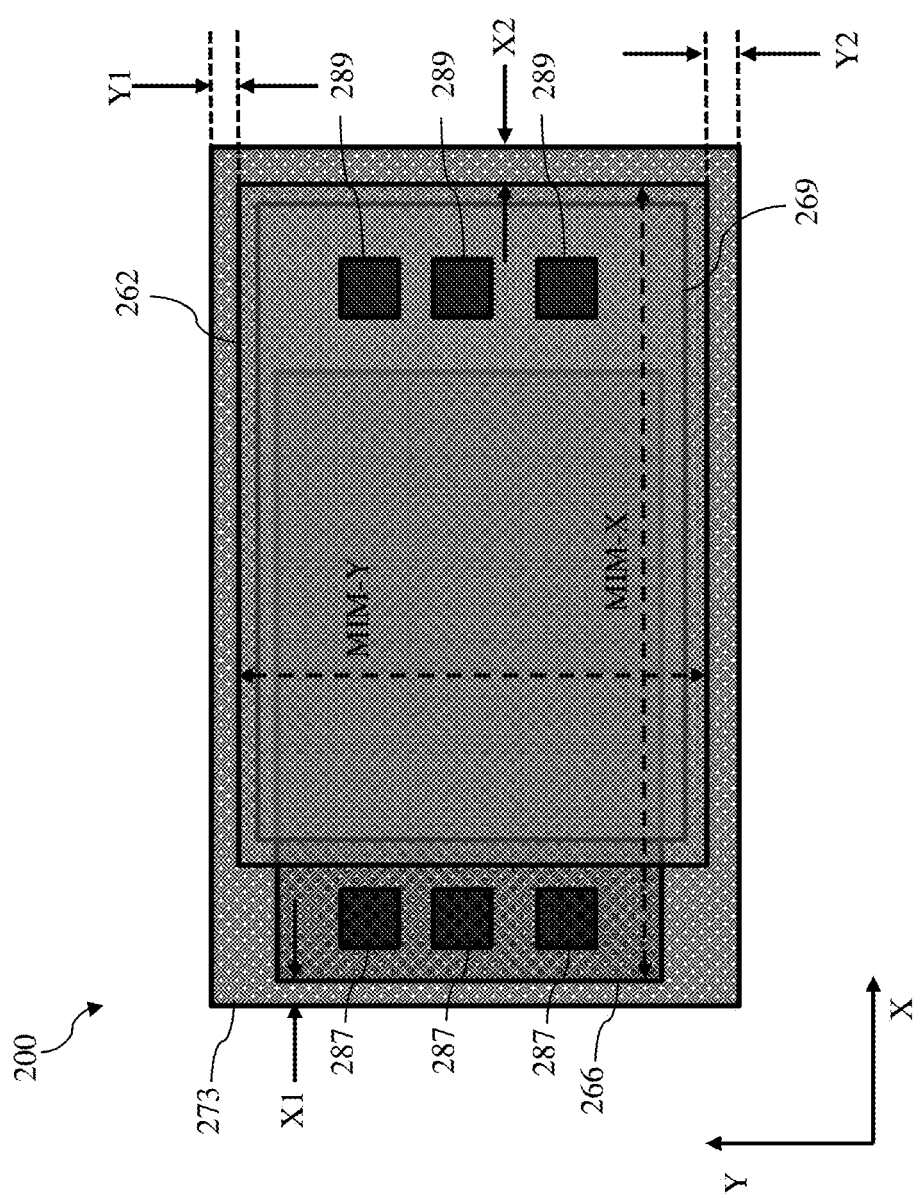
FIGS. 19, 20, and 21 provide top views of various devices fabricated in accordance with the method of FIG. 1, according to some embodiments.
Figure 20:
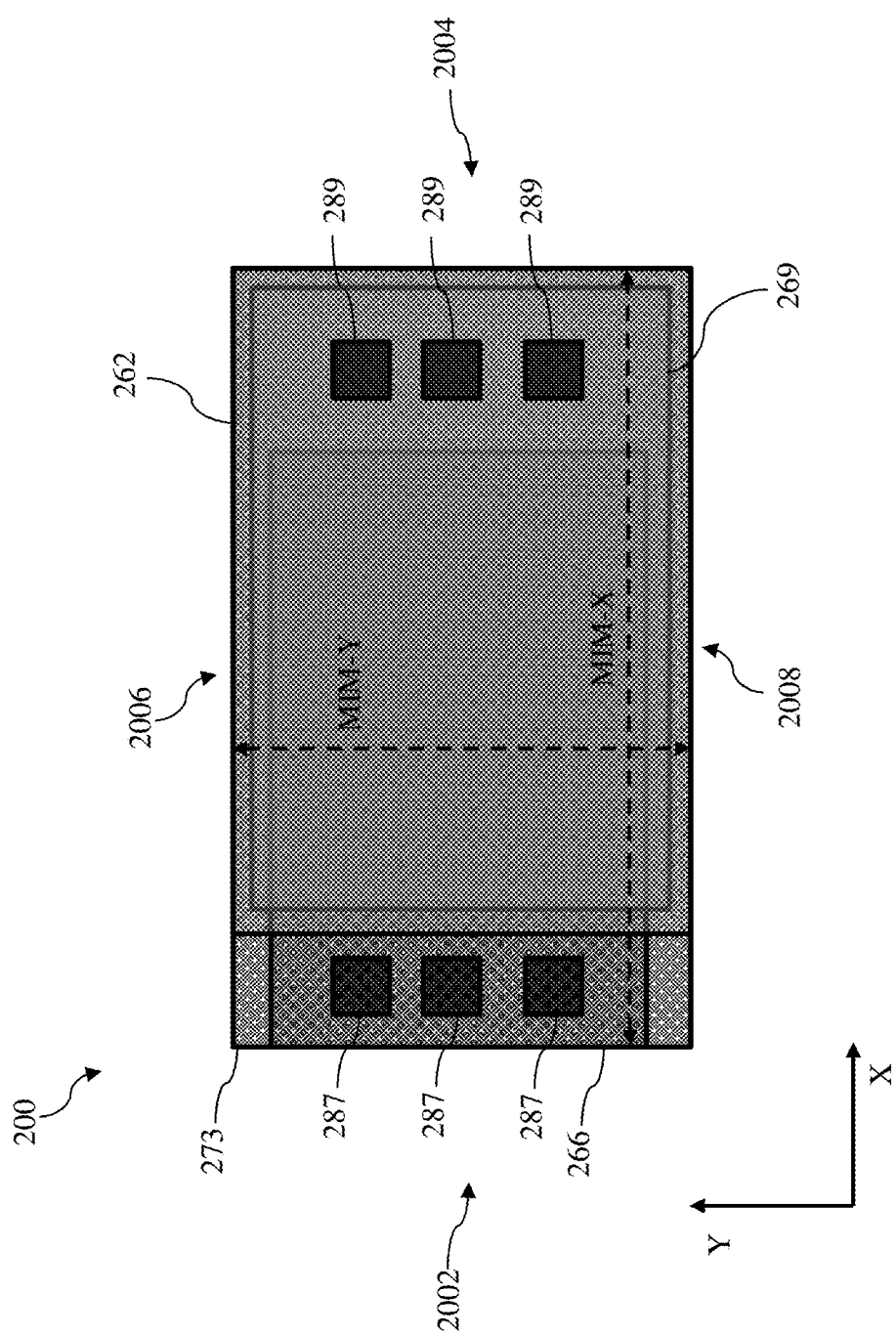
Figure 21:
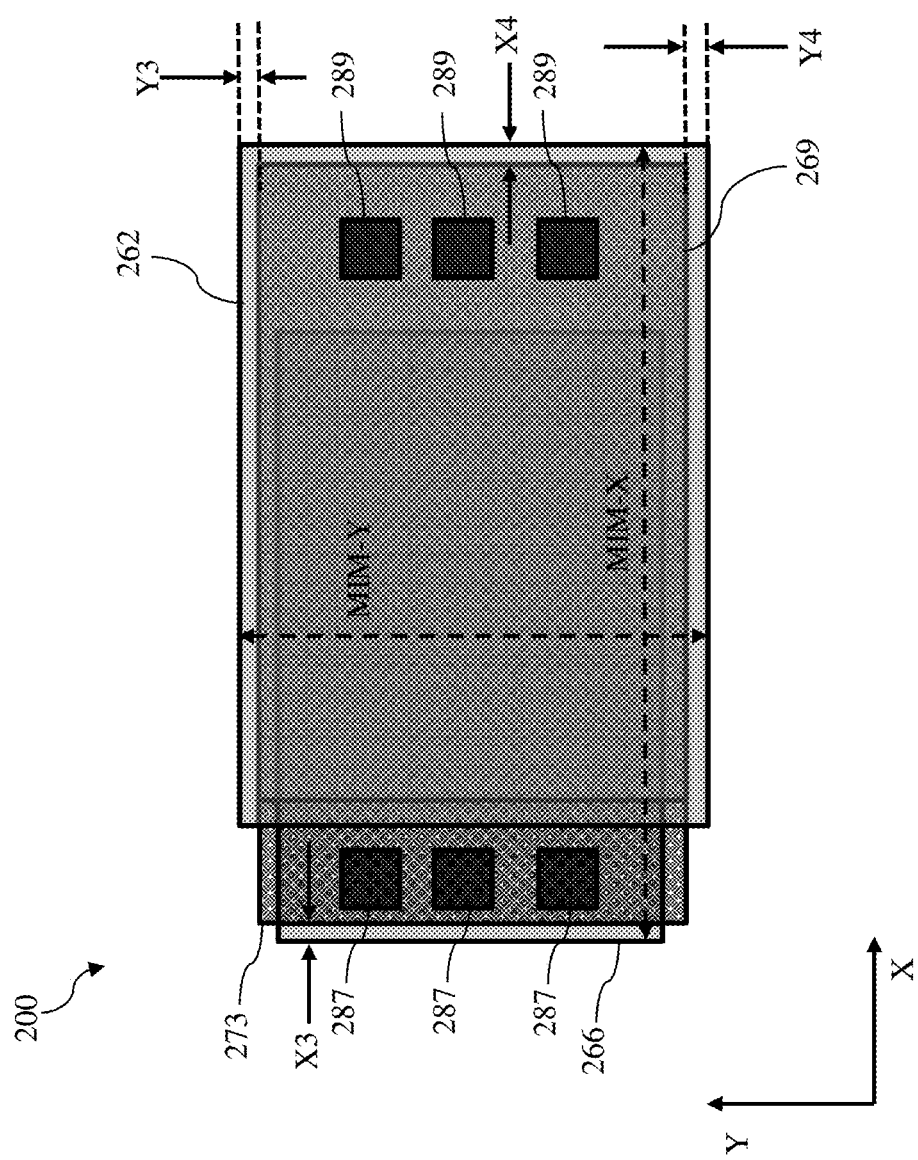

In furtherance of the above, reference is made to FIGS. 19, 20, and 21, which provide top views of the device 200 and which illustrate different size areas for the stress-reduction feature 273 relative to the MIM structure 260. The MIM structure 260, as previously discussed, includes the bottom conductor plate layer 262, the middle conductor plate layer 266, and the top conductor plate layer 269, as well as insulator layers which interpose adjacent conductor plates. Thus, each of the top views of FIGS. 19, 20, and 21 illustrate the bottom conductor plate layer 262, the middle conductor plate layer 266, and the top conductor plate layer 269. FIGS. 19, 20, and 21 also illustrate an exemplary embodiment of the sizes of each of the bottom conductor plate layer 262, the middle conductor plate layer 266, and the top conductor plate layer 269 relative to each other and relative to the stress-reduction feature 273. For example, a length of the top conductor plate 269 along a Y-axis may be larger than a corresponding length of the middle conductor plate 266 along the Y-axis, while both a length and a width (along the Y-axis and the X-axis, respectively) of the bottom conductor plate 262 may be larger than a corresponding length and width (along the Y-axis and the X-axis, respectively) of the top conductor plate 269. To be sure, the relative dimensions of the bottom conductor plate layer 262, the middle conductor plate layer 266, and the top conductor plate layer 269 are merely illustrative, and other relative dimensions of the various conductor plates may equally be used without departing from the scope of the present disclosure. For instance, in at least some embodiments, two or more of the bottom conductor plate layer 262, the middle conductor plate layer 266, and the top conductor plate layer 269 may have one or both of a length and a width (along the Y-axis and the X-axis, respectively) that are substantially equal to each other. In addition, FIGS. 19, 20, and 21 illustrate contact features 287 and 289, which are discussed in more detail below, and which provide electrical contact to respective ones of the bottom conductor plate layer 262, the middle conductor plate layer 266, and the top conductor plate layer 269. While the device 200 is shown as including three contact features coupled to each end (e.g., to each electrode) of the MIM structure 260, it will be understood that more or less contact features may equally be used without departing from the scope of the present disclosure.

With reference to the stress-reduction feature 273, and as shown in the example of FIG. 19, the area of the stress-reduction feature 273 may be greater than the area of the MIM structure 260 such that the entire MIM structure 260 remains covered by the stress-reduction feature 273. For purposes of discussion, an area of the MIM structure 260 may be defined in part by the furthest distances spanned by the MIM structure 260 (e.g., such as the furthest distances spanned by the constituent conductor plate layers) along the X-axis and the Y-axis. For instance, in the examples of FIGS. 19, 20, and 21, the area of the MIM structure 260 may be defined in part by a MIM structure X-dimension 'MIM-X' and a MIM structure Y-dimension 'MIM-Y'. In the example of FIG. 19, where the area of the stress-reduction feature 273 may be greater than the area of the MIM structure 260, the stress-reduction feature 273 may extend beyond (e.g., overlap) an edge of the MIM structure 260, the edge of the MIM structure 260 defined as an edge of the nearest conductor plate layer (e.g., such as one of the bottom conductor plate layer 262, the middle conductor plate layer 266, or the top conductor plate layer 269). In some embodiments, the stress-reduction feature 273 extends beyond an edge of a first side of the MIM structure 260 (e.g., including an edge of the middle conductor plate layer 266) by a length 'X1' and beyond an edge of a second side of the MIM structure 260 (e.g., including a lateral edge of the bottom conductor plate layer 262) by a length 'X2'. In some cases, the stress-reduction feature 273 also extends beyond an edge of a third side of the MIM structure 260 (e.g., including a top edge of the bottom conductor plate layer 262) by a length 'Y1' and beyond an edge of a fourth side of the MIM structure 260 (e.g., including a bottom edge of the bottom conductor plate layer 262) by a length 'Y2'. In some cases, each of the lengths 'X1', 'X2', 'Y1', 'Y2' may be substantially equal. However, in some examples two or more of the lengths 'X1', 'X2', 'Y1', 'Y2' may be different. Generally, and in some embodiments, the lengths 'X1' and 'X2' may be between about 0%-10% of the MIM structure X-dimension 'MIM-X'. Thus, merely as one illustrative example, if the MIM structure X-dimension 'MIM-X' is equal to 100 nm, then the lengths 'X1' and 'X2' may be between about 0 nm and 10 nm. Similarly, and in some embodiments, the lengths 'Y1' and 'Y2' may be between about 0%-10% of the MIM structure Y-dimension 'MIM-Y'. Thus, merely as one illustrative example, if the MIM structure Y-dimension 'MIM-Y' is equal to 100 nm, then the lengths 'Y1' and 'Y2' may be between about 0 nm and 10 nm. Additionally, in some examples, the lengths 'X1', 'X2', 'Y1', 'Y2' may be sized such that the area of the stress-reduction feature 273 may be between about 0%-10% greater than the area of the MIM structure 260.

Referring to the example of FIG. 20, the area of the stress-reduction feature 273 may be largely equal to the area of the MIM structure 260 such that, once again, the entire MIM structure 260 remains covered by the stress-reduction feature 273. In the example of FIG. 20, edges of the stress-reduction feature 273 may be substantially aligned with edges of the MIM structure 260. For example, in some embodiments, the stress-reduction feature 273 may be substantially aligned with an edge of the middle conductor plate layer 266 along a first lateral side 2002 of the MIM structure 260 and with an edge of the bottom conductor plate layer 262 along a second lateral side 2004 of the MIM structure 260. In some cases, the stress-reduction feature 273 may further be substantially aligned with an edge of the bottom conductor plate layer 262 along a third lateral side 2006 of the MIM structure 260 and with an edge of the bottom conductor plate layer 262 along a fourth lateral side 2008 of the MIM structure 260. Thus, in some embodiments, an X-axis dimension of the stress-reduction feature 273 may be substantially equal to the MIM structure X-dimension 'MIM-X', and a Y-axis dimension of the stress-reduction feature 273 may be substantially equal to the MIM structure Y-dimension 'MIM-Y'.

With reference to the example of FIG. 21, the area of the stress-reduction feature 273 may be less than the area of the MIM structure 260, while still covering a major portion of the MIM structure 260. In the example of FIG. 21, where the area of the stress-reduction feature 273 may be less than the area of the MIM structure 260, the stress-reduction feature 273 may underlap an edge of the MIM structure 260. For example, in some embodiments, the stress-reduction feature 273 may underlap an edge of a first side of the MIM structure 260 (e.g., including an edge of the middle conductor plate layer 266) by a length 'X3' and an edge of a second side of the MIM structure 260 (e.g., including a lateral edge of the bottom conductor plate layer 262) by a length 'X4'. In some cases, the stress-reduction feature 273 also underlaps an edge of a third side of the MIM structure 260 (e.g., including a top edge of the bottom conductor plate layer 262) by a length 'Y3' and an edge of a fourth side of the MIM structure 260 (e.g., including a bottom edge of the bottom conductor plate layer 262) by a length 'Y4'. In some cases, each of the lengths 'X3', 'X4', 'Y3', 'Y4' may be substantially equal. However, in some examples two or more of the lengths 'X3', 'X4', 'Y3', 'Y4' may be different. Generally, and in some embodiments, the lengths 'X3' and 'X4' may be between about 0%-10% of the MIM structure X-dimension 'MIM-X'. Thus, for example, if the MIM structure X-dimension 'MIM-X' is equal to 100 nm, then the lengths 'X3' and 'X4' may be between about 0 nm and 10 nm. Similarly, and in some embodiments, the lengths 'Y3' and 'Y4' may be between about 0%-10% of the MIM structure Y-dimension 'MIM-Y'. Thus, once again, if the MIM structure Y-dimension 'MIM-Y' is equal to 100 nm, then the lengths 'Y3' and 'Y4' may be between about 0 nm and 10 nm. Additionally, in some examples, the lengths 'X3', 'X4', 'Y3', 'Y4' may be sized such that the area of the stress-reduction feature 273 may be between about 0%-10% less than the area of the MIM structure 260.

Figure 10:
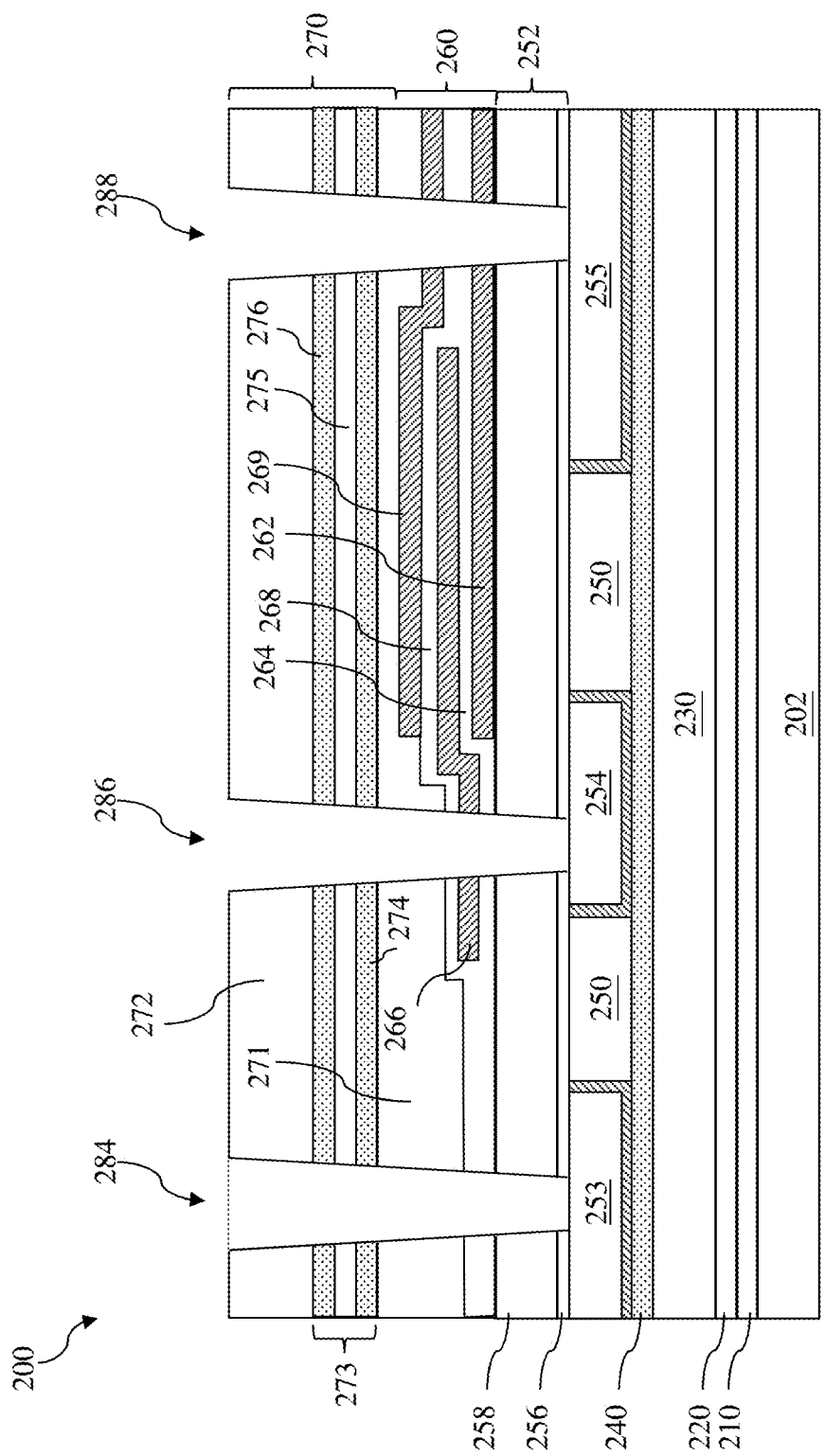

Returning to discussion of the method 100 and for purposes of this discussion, it will be assumed that the optional patterning of the stress-reduction feature 273 is skipped. Thus, the method 100 may proceed from block 110 to block 114 where openings are formed to expose the lower contact features. As shown in FIG. 10, and in an embodiment of block 114, openings 284, 286, 288 are formed. The opening 284 may penetrate through, from top to bottom, the second passivation layer 270 (including the second dielectric portion 272, the stress-reduction feature 273 and the first dielectric portion 271), the insulator layers 268, 264 and the first passivation layer 252 (including the dielectric layer 258 and the dielectric layer 256) to expose a top surface of the lower contact feature 253. The opening 286 may penetrate through, from top to bottom, the second passivation layer 270, a portion of the MIM structure 260 (including the insulator layer 268, the middle conductor plate layer 266, and the insulator layer 264), and the first passivation layer 252 to expose a top surface of the lower contact feature 254. The opening 288 may penetrate through, from top to bottom, the second passivation layer 270, a portion of the MIM structure 260 (including the top conductor plate layer 269, the insulator layers 268, 264, and the bottom conductor plate layer 262), and the first passivation layer 252 to expose a top surface of the lower contact feature 255. In some embodiments, the openings 284, 286, 288 may be formed using an etching process (e.g., such as a dry etching process, a wet etching process, or a combination thereof). In various embodiments, sidewalls of each of the openings 284, 286, 288 may expose sidewalls of the various layers through which the openings 284, 286, 288 penetrate.

Figure 11:
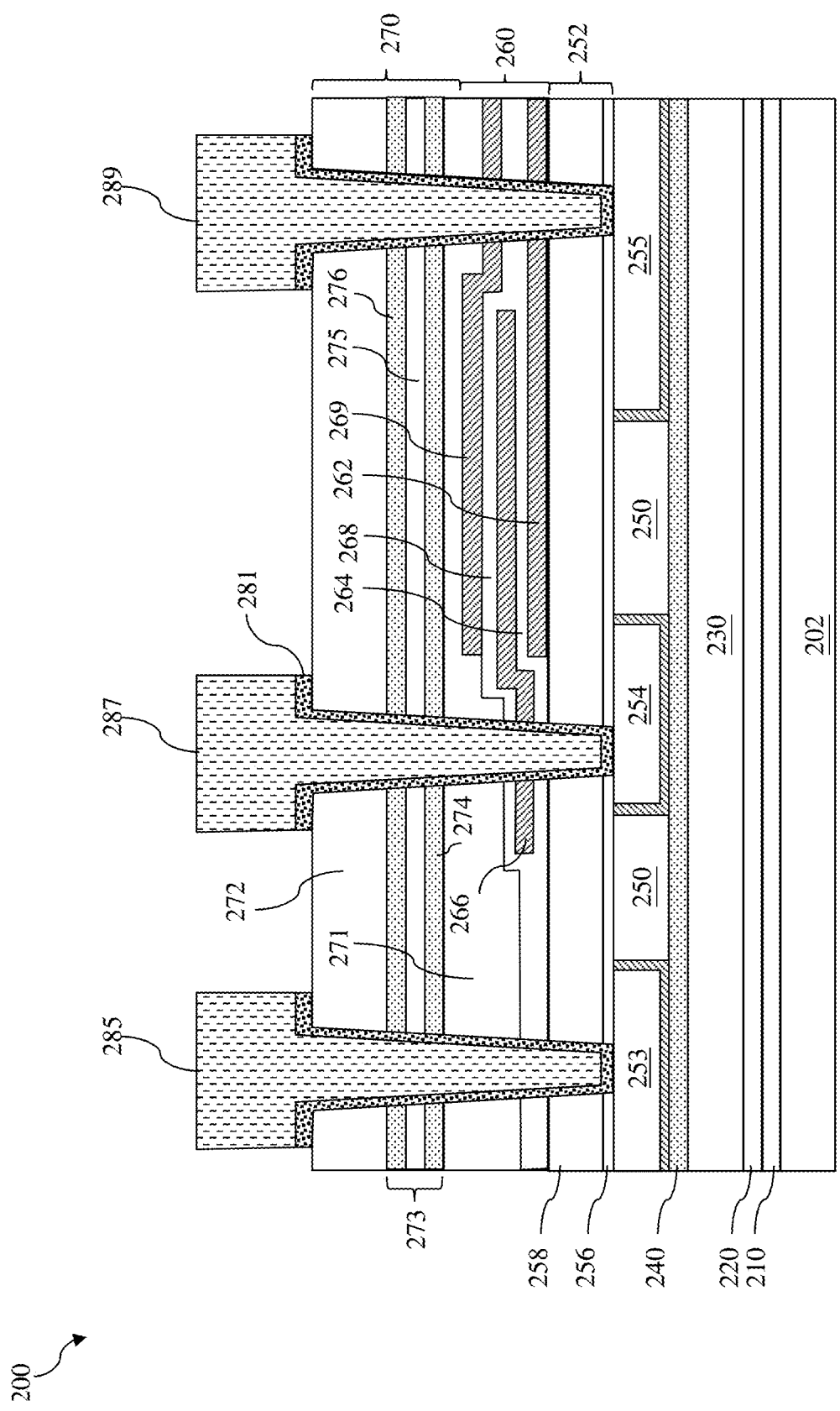

The method 100 then proceeds to block 116 where upper contact features are formed. With reference to FIG. 11, and in an embodiment of block 116, upper contact features 285, 287, 289 are formed in and over each of the openings 284, 286, 288, respectively. The upper contact features 285, 287, 289 include contact vias that fill the openings 284, 286, 288 and may be referred to as contact via, metal vias, or metal lines. In some embodiments, to form the upper contact features 285, 287, 289, a barrier layer 281 is first conformally deposited over the second dielectric portion 272 and into the openings 284, 286, 288 using a suitable deposition technique, such as ALD, PVD, or CVD, and then a metal fill layer is deposited over the barrier layer 281 using a suitable deposition technique, such as ALD, PVD, or CVD. The deposited barrier layer 281 and the metal fill layer are then patterned to form the upper contact features 285, 287, 289, as illustrated in the example in FIG. 11. In some cases, the contact features 285, 287, 289, may be referred to as contact pads. In some embodiments, the barrier layer 281 and the metal fill layer are patterned in a two-stage or multiple-stage etch process. In the example of FIG. 11, portions of the upper contact features 285, 287, 289 above the second dielectric portion 272 have substantially straight sidewalls. However, in some alternative embodiments, portions of the upper contact features 285, 287, 289 above the second dielectric portion 272 may have tapered sidewalls.

In some embodiments, an upper portion of the upper contact features 285, 287, 289 are part of a redistribution layer (RDL) that includes various metal lines used to redistribute bonding pads to different locations, such as from peripheral locations to being uniformly distributed on chip surface. In various examples, the RDL couples the multi-layer interconnect (MLI) structure to the bonding pads, for connection to external circuitry. The upper contact features 285, 287, 289 provide electrical contact to the lower contact features 253, 254, 255, respectively. In addition, and as shown in the example of FIG. 11, the upper contact feature 287 is electrically coupled to the middle conductor plate layer 266, while being electrically isolated from the bottom conductor plate layer 262 and the top conductor plate layer 269. Further, the upper contact feature 289 is electrically coupled to the bottom conductor plate layer 262 and the top conductor plate layer 269, while being electrically isolation from the middle conductor plate layer 266. Thus, the upper contact feature 287 provides electrical contact to a first terminal of the MIM structure 260, and the upper contact feature 289 provides electrical contact to a second terminal of the MIM structure 260. It is also noted that the upper contact features 285, 287, 289, being disposed above (or near) the MIM structure 260, may induce stress that is released by the stress-reduction feature 273 rather than being induced on the MIM structure 260. In addition, cracks and/or other defects originating within, or propagating through, the upper contact features 285, 287, 289, will be stopped by the embedded stress-reduction feature 273 instead of propagating to the MIM structure 260, thereby preventing the formation of cracks and/or other defects within the MIM structure 260.

Figure 12:
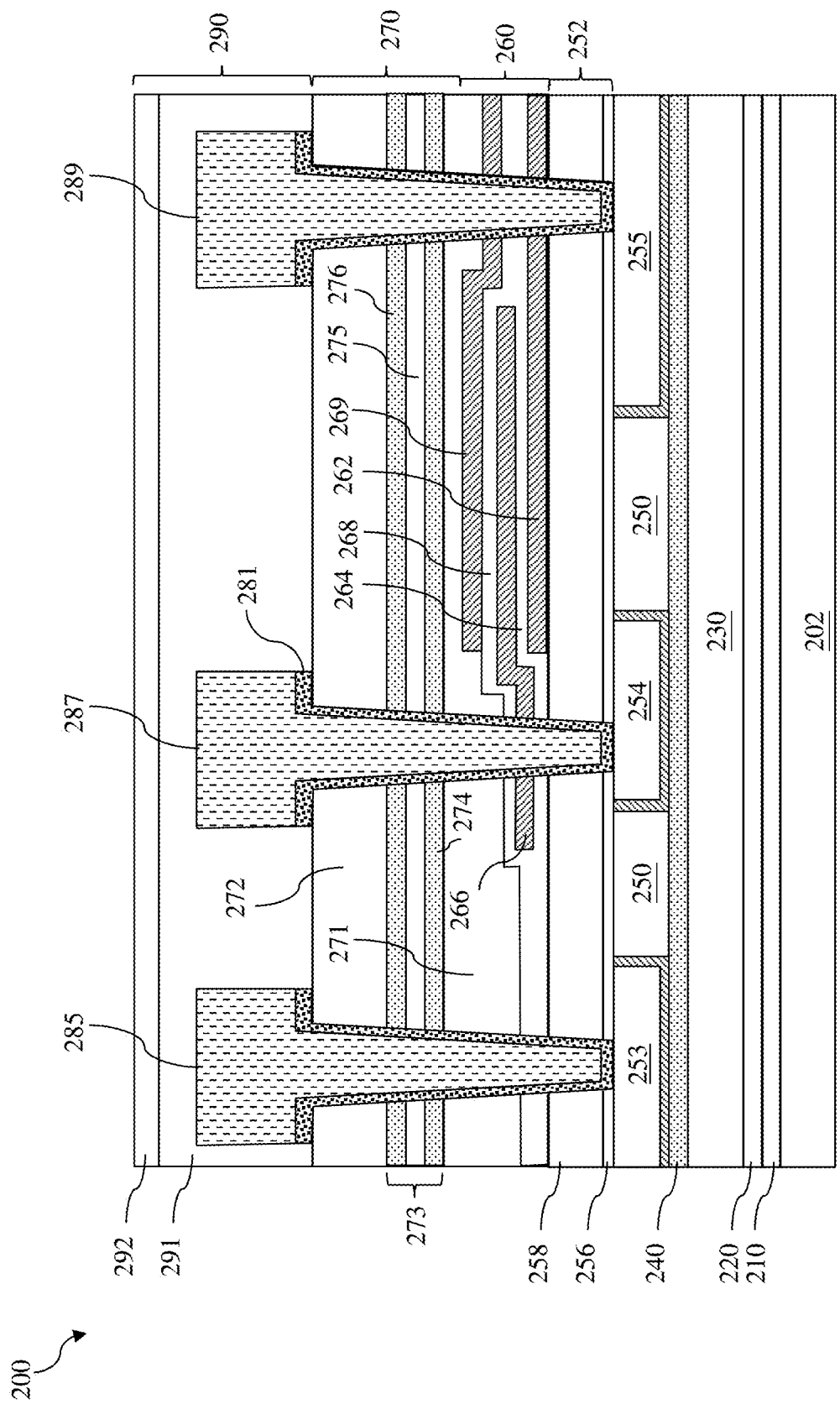

The method 100 proceeds to block 118 where a third passivation layer is formed. Referring to FIG. 12, and in an embodiment of block 118, a third passivation layer 290 is formed over device 200 including over the upper contact features 285, 287, 289 and over the second dielectric portion 272. In some embodiments, the third passivation layer 290 includes a dielectric layer 291 formed over the upper contact features 285, 287, 289 and over the second dielectric portion 272. In some embodiments, the dielectric layer 291 may include silicon oxide or a silicon oxide containing material. In some cases, the dielectric layer 291 may include undoped silicate glass (USG). The dielectric layer 291 may be deposited by PECVD, HDP-CVD, SACVD, ALD, PVD, or a combination thereof. Thus, in some cases, the dielectric layer 291 may be referred to as a plasma-enhanced oxide (PEOX). In some cases, the dielectric layer 291 may have a thickness of about 1200 nm. In other embodiments, the dielectric layer 291 may have a thickness of between about 1000 nm and about 1400 nm. In some examples, the third passivation layer 290 further includes a dielectric layer 292 formed over the dielectric layer 291. In some embodiments, the dielectric layer 292 is about 700 nm thick. In other embodiments, the dielectric layer 292 may have a thickness of between about 600 nm and about 800 nm. The dielectric layer 292 may include a nitrogen-containing material and/or a carbon-containing material. For example, the dielectric layer 292 may include SiCN, SiOC, SiC, SiOCN, SiN, or combinations thereof. In various examples, the dielectric layer 292 may be deposited by CVD, ALD, PVD, or combinations thereof. It is further noted that stress induced by the third passivation layer 290 (including the dielectric layers 291, 292), which is disposed above the stress-reduction feature 273, may be released by the stress-reduction feature 273 rather than being induced on the MIM structure 260. Also, cracks and/or other defects originating within, or propagating through, the third passivation layer 290, will be stopped by the embedded stress-reduction feature 273 instead of propagating to the MIM structure 260, thereby preventing the formation of cracks and/or other defects within the MIM structure 260.

Figure 13:
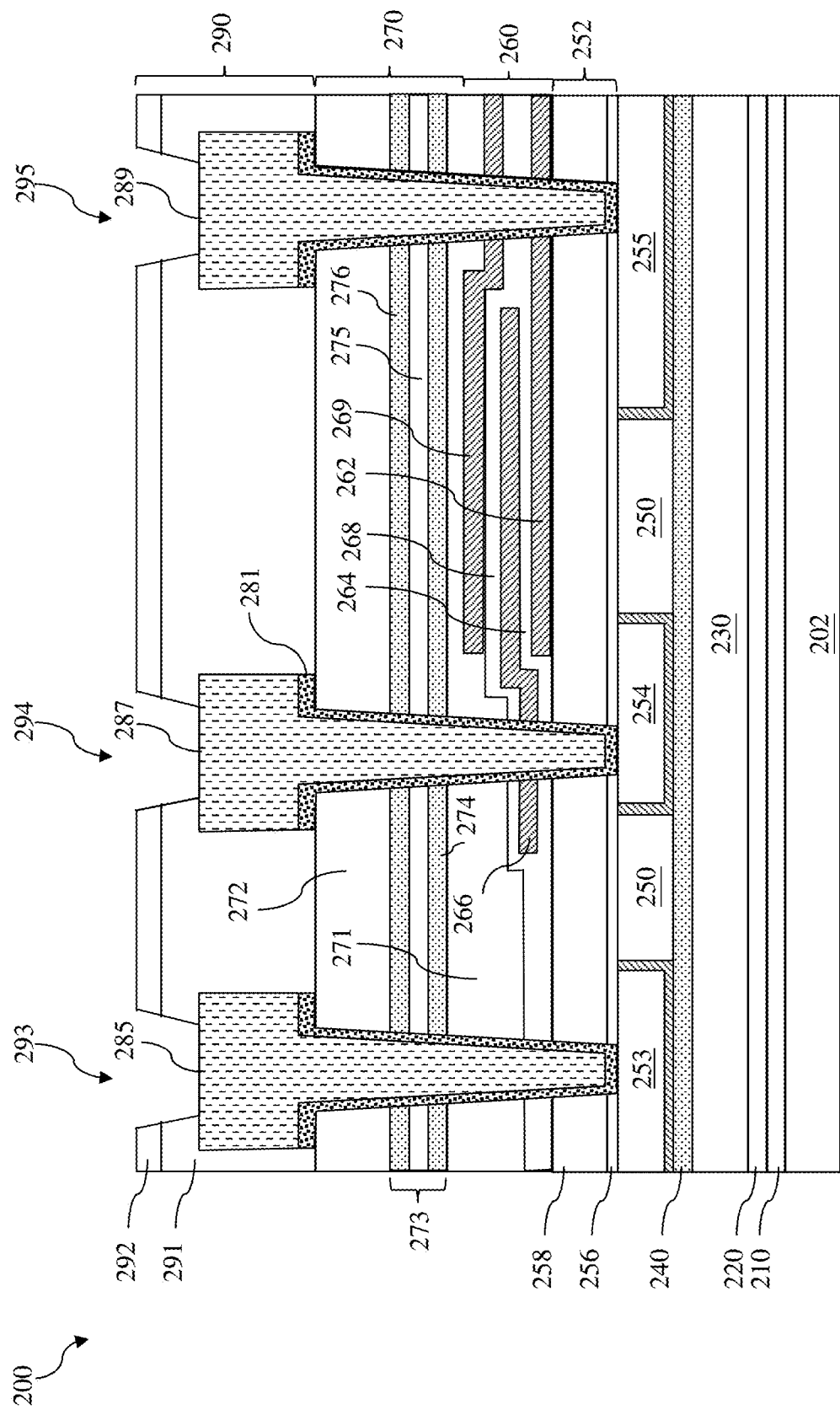

The method 100 proceeds to block 120 where openings are formed to expose the upper contact features. As shown in FIG. 13, and in an embodiment of block 120, openings 293, 294, 295 are formed. In some embodiments, each of the openings 293, 294, 295 may penetrate through, from top to bottom, the dielectric layer 292 and the dielectric layer 291 of the third passivation layer 290 to expose top surfaces of the upper contact features 285, 287, 289, respectively. In some embodiments, the openings 293, 294, 295 may be formed using an etching process (e.g., such as a dry etching process, a wet etching process, or a combination thereof). In various embodiments, sidewalls of each of the openings 293, 294, 295 may expose sidewalls of the various layers through which the openings 293, 294, 295 penetrate.

Figure 14:
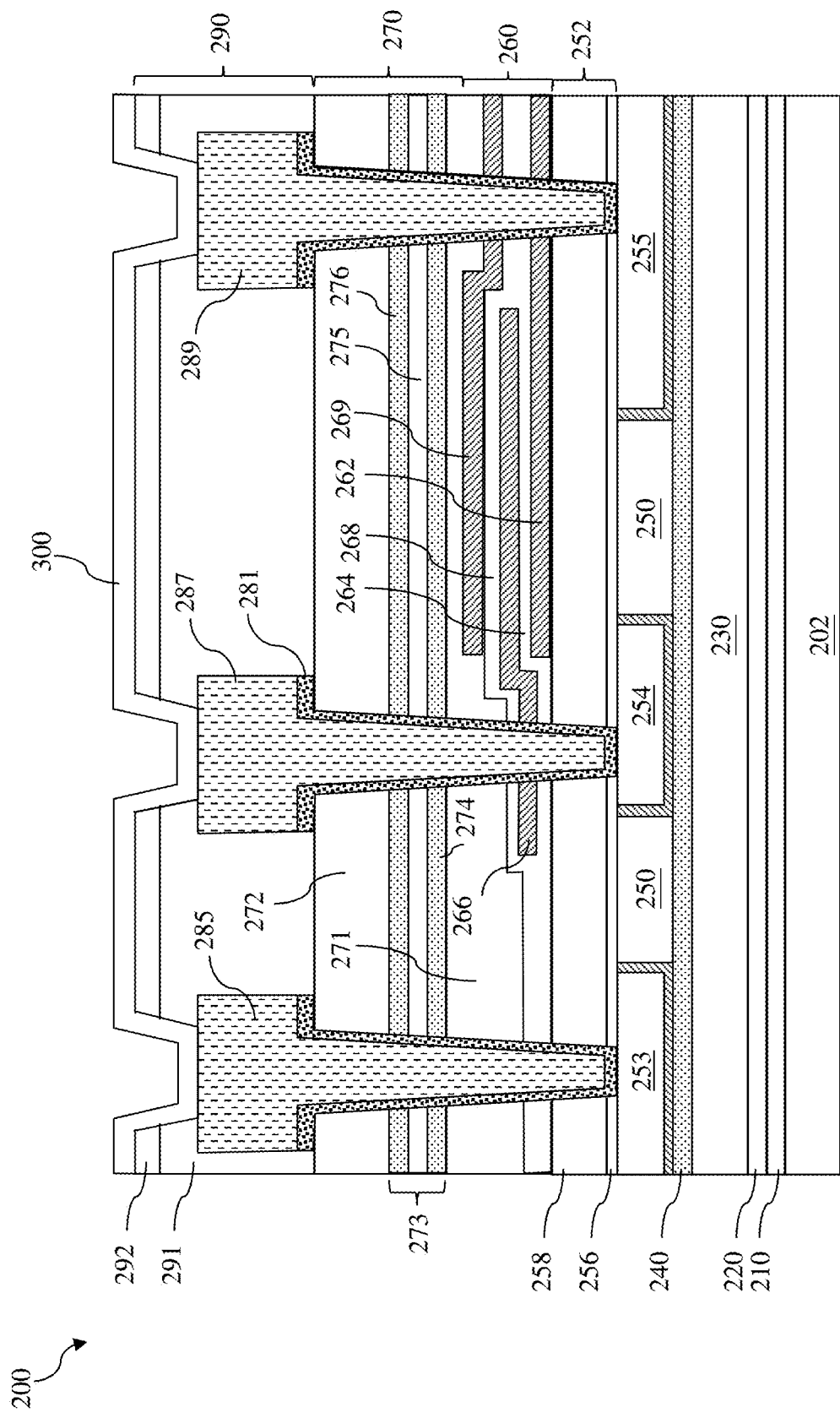
Figure 15:
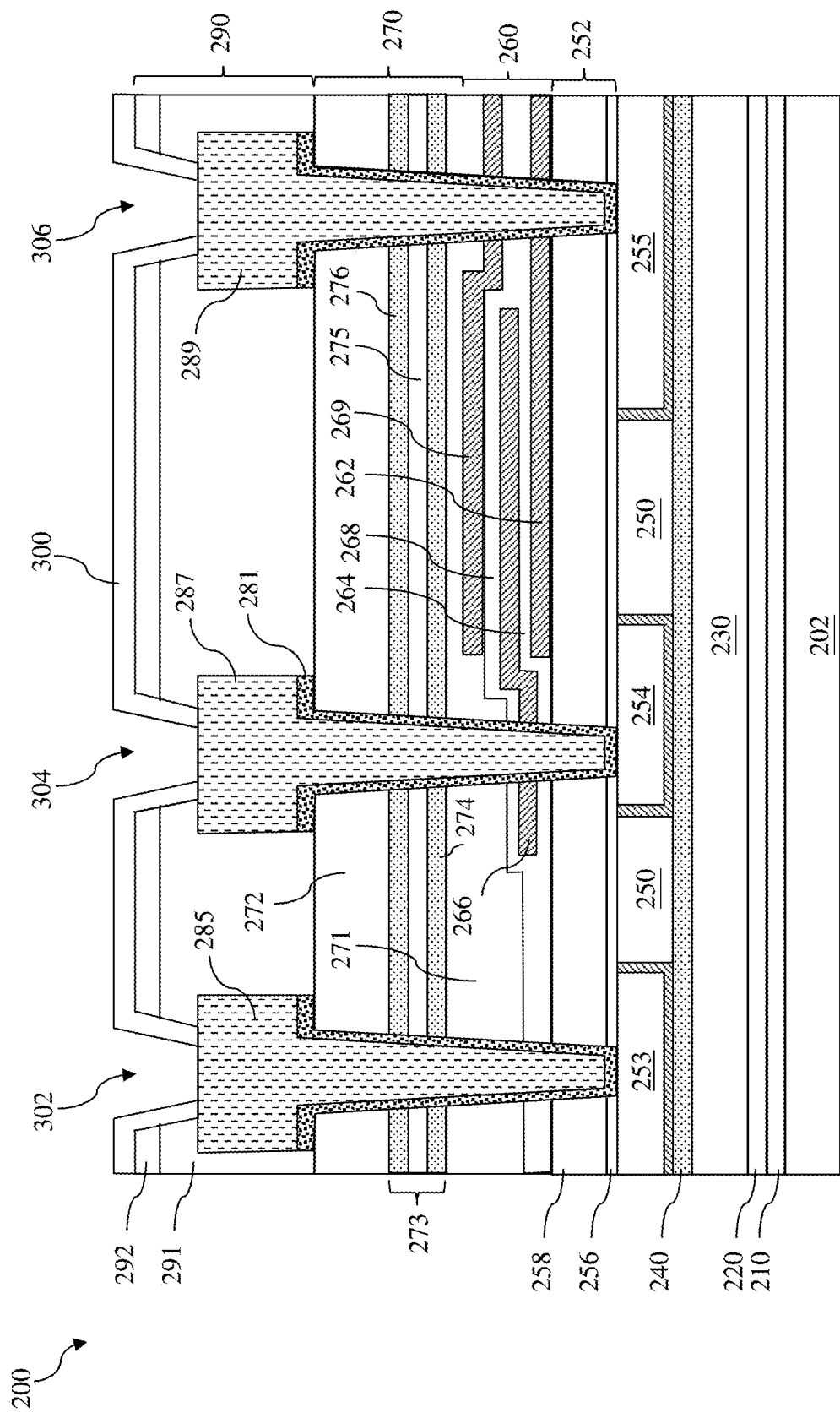

The method 100 proceeds to block 122 where a patterned polyimide (PI) layer is formed. Formation of the patterned PI layer includes multiple steps including deposition of the PI layer and patterning of the PI layer. With reference to FIGS. 14 and 15, in an embodiment of block 122, a PI layer 300 is first conformally deposited over the dielectric layer 292 and into the openings 293, 294, 295 using a suitable deposition technique, such as spin-coating. In some examples, the PI layer 300 may have a thickness of between about 5 µm and about 10 µm. In some embodiments, a baking process may be performed after deposition of the PI layer 300. The deposited PI layer 300 may then be patterned using a suitable combination of photolithography processes (e.g., such as photoresist deposition, exposure, and development) to form an etch mask, and an etching process may be performed using the etch mask to form openings 302, 304, 306 that expose top surfaces of the upper contact features 285, 287, 289, respectively. In at least some embodiments, the PI layer 300 includes a photosensitive chemical such that the PI layer 300 may be simply patterned by a photolithography process, without a subsequent etch process. In various embodiments, stress induced by the PI layer 300 may be released by the stress-reduction feature 273 rather than being induced on the MIM structure 260. Further, cracks and/or other defects originating within, or propagating through, the PI layer 300, will be stopped by the embedded stress-reduction feature 273 instead of propagating to the MIM structure 260, thereby preventing the formation of cracks and/or other defects within the MIM structure 260.

Figure 16:
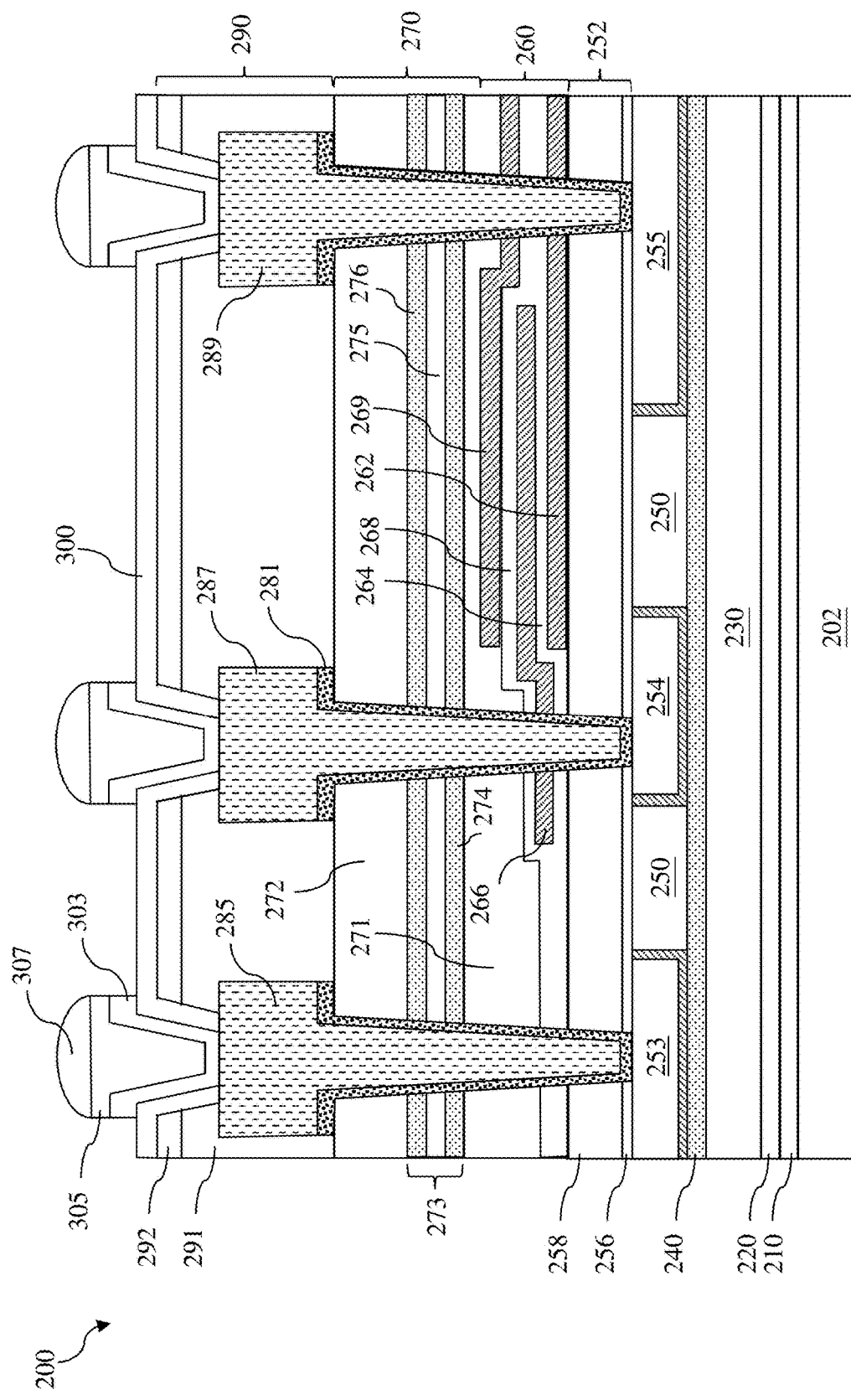

The method 100 proceeds to block 124 where a bumping process is performed. With reference to FIG. 16, in an embodiment of block 124, a bumping process includes forming of under-bump metallization (UBM) 303, a copper (Cu) pillar 305 (or Cu bump) over the UBM 303, and a solder bump 307 over the Cu pillar 305. In some embodiments, the UBM 303 provides a low resistance electrical connection to the RDL within the upper portion of the upper contact features 285, 287, 289. The UBM 303 also hermetically seals and prevents diffusion of other bump metals into the device 200. In various examples, the UBM 303 includes multiple layers of different metals such as an adhesion layer (e.g., Ti, Cr, Al or a combination thereof), a diffusion barrier layer (e.g., CrCu alloy), a solderable layer, and an oxidation barrier layer (e.g., Au). The various layers of the UBM 303 may be deposited by electroplating, sputtering, evaporation, or other suitable method. In some embodiments, a Cu seed layer may be deposited prior to formation of the Cu pillar 305, which may be formed by an electroplating process. In addition, and in some cases, a diffusion barrier (e.g., such as Ni) may be formed between the Cu pillar 305 and the solder bump 307, to prevent formation of an intermetallic layer and/or to prevent the formation of microvoids. After formation of the Cu pillar 305, a plating process may be used to form the solder bump 307 over the Cu pillar 305. One or more patterning process (e.g., lithography and/or etching processes) may be performed to pattern one or more of the layers deposited during the bumping process. In some embodiments, a reflow process may also be performed after deposition of the solder to form the solder bump 307. By way of example, formation of the UBM 303, the Cu pillar 305, and the solder bump 307 provide contact structures for connection to external circuitry. In some examples, stress induced by the UBM 303, the Cu pillar 305, and/or the solder bump 307 may be released by the stress-reduction feature 273 rather than being induced on the MIM structure 260. Further, cracks and/or other defects originating within, or propagating through, the UBM 303, the Cu pillar 305, and/or the solder bump 307, will be stopped by the embedded stress-reduction feature 273 instead of propagating to the MIM structure 260, thereby preventing the formation of cracks and/or other defects within the MIM structure 260.

Figure 17:
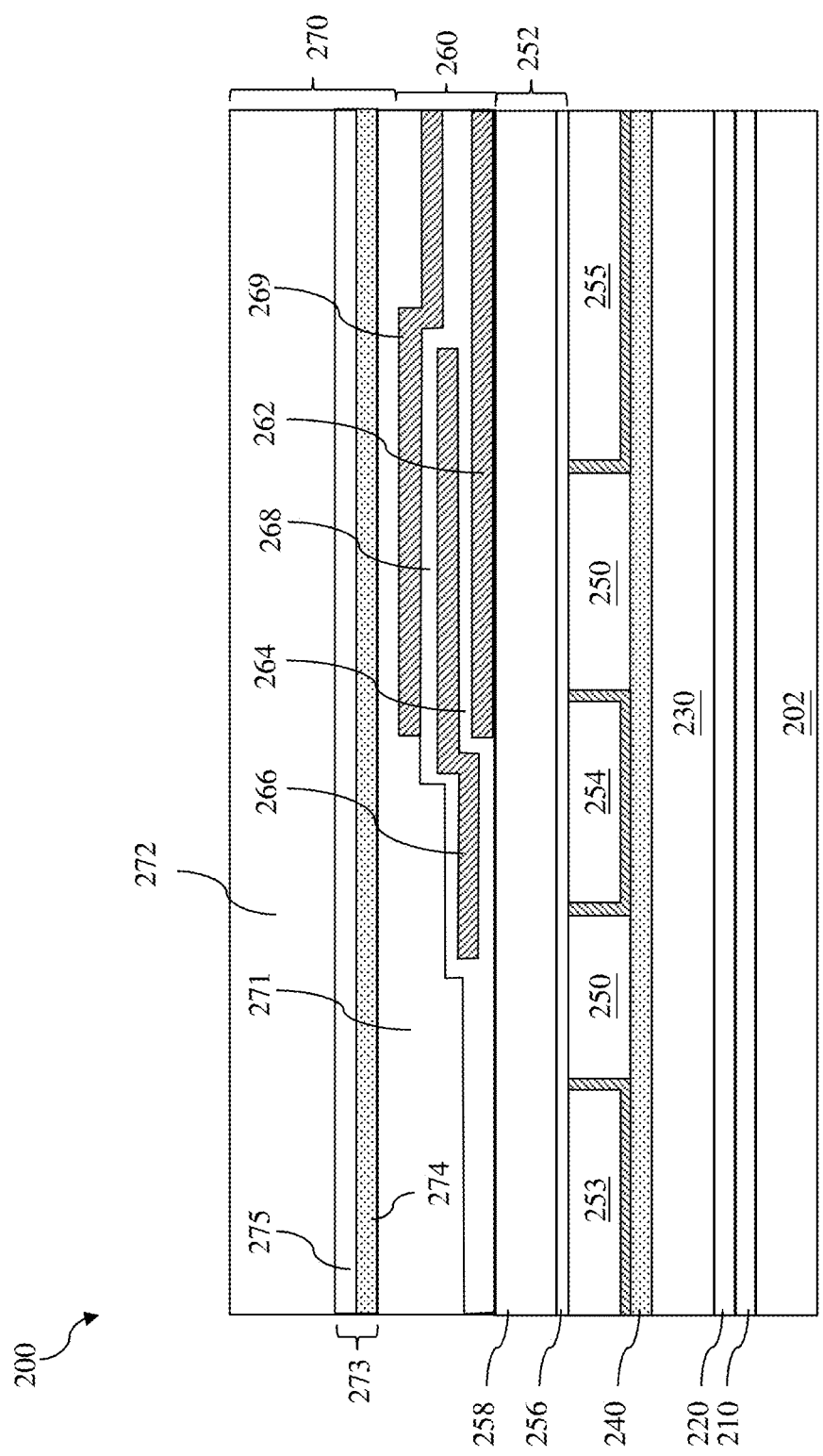
FIGS. 17 and 18 provide cross-sectional views of alternative embodiments of a device processed in accordance with the method of FIG. 1, according to some embodiments.
Figure 18:
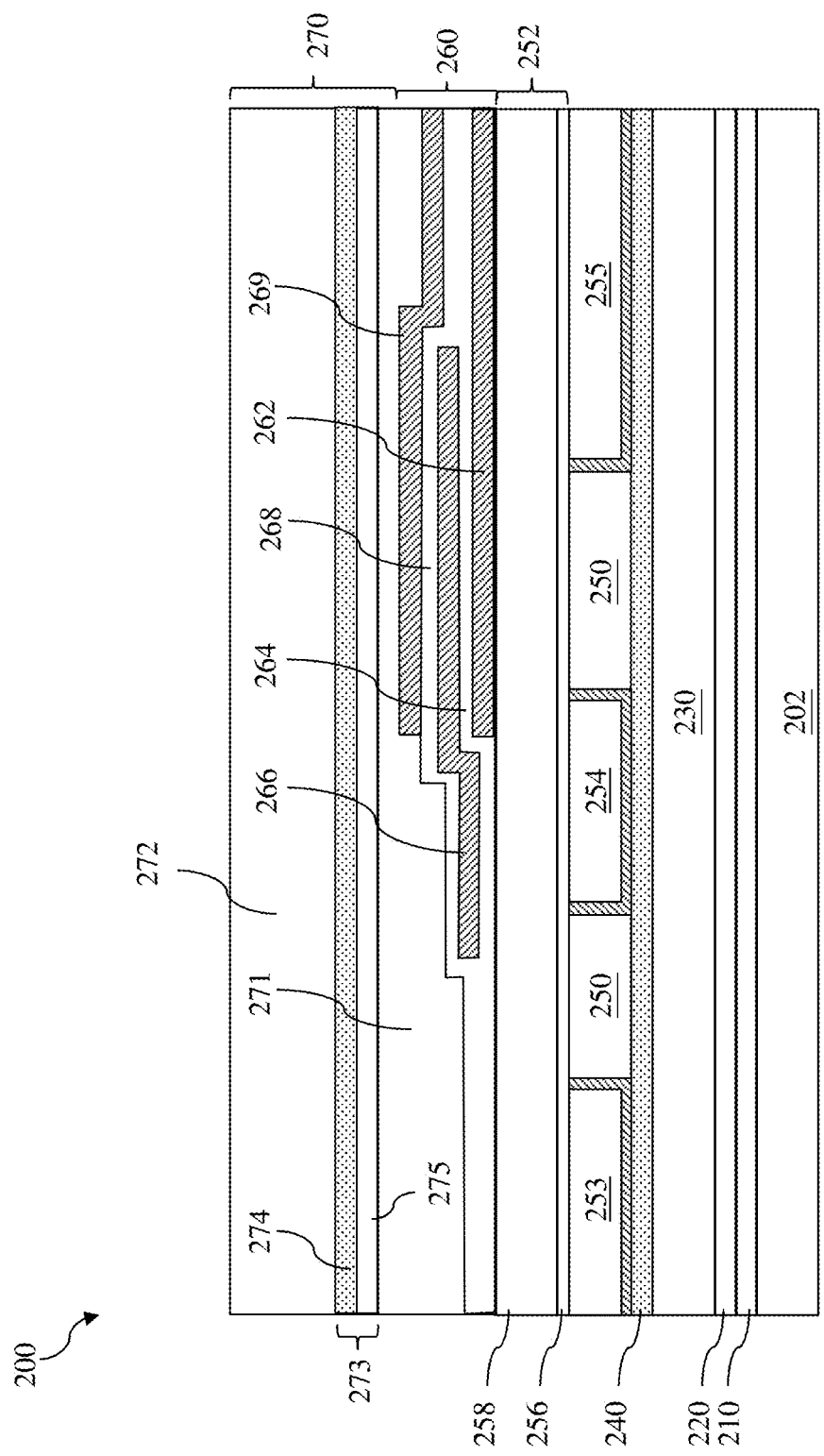

It is understood that the method 100, discussed above with reference to FIGS. 2-16, is merely exemplary and is not intended to limit the present disclosure to what is explicitly shown and described with reference to the method 100. For example, while the stress-reduction feature 273 has been described as including a nitrogen-oxygen-nitrogen (NON) multi-layer structure, the stress-reduction feature 273 may likewise include other nitrogen-containing multi-layer structures, without departing from the scope of the present disclosure. In some embodiments, and with reference to FIG. 17, the device 200 may include the stress-reduction feature 273 having the nitrogen-containing layer 274 and the oxygen-containing layer 275 formed over the nitrogen-containing layer 274, while the second dielectric portion 272 may be formed directly on the oxygen-containing layer 275. Thus, in some examples, the stress-reduction feature 273 may include a nitrogen-oxygen (NO) multi-layer structure. In other embodiments, and with reference to FIG. 18, the device 200 may include the stress-reduction feature 273 having the oxygen-containing layer 275 and the nitrogen-containing layer 274 formed over the oxygen-containing layer 275, while the second dielectric portion 272 may be formed directly on the nitrogen-containing layer 274. Thus, in some examples, the stress-reduction feature 273 may include an oxygen-nitrogen (ON) multi-layer structure. It is noted that each of the examples shown in FIGS. 17 and 18 may include embodiments of block 110 of the method 100, where the second passivation layer having the embedded stress-reduction feature is formed.

The various embodiments described herein thus offer several advantages over the existing art. It will be understood that not all advantages have been necessarily discussed herein, no particular advantage is required for all embodiments, and other embodiments may offer different advantages. As one example, embodiments discussed herein include methods and structures for releasing stress that would otherwise be induced on MIM capacitors and for preventing stress-induced damage to MIM capacitors. In some embodiments, a stress-reduction feature is embedded within a passivation layer disposed over a MIM capacitor to provide the stress release and thus prevent damage to the MIM capacitor. In some examples, the stress-reduction feature includes a NON multi-layer structure having an oxygen-containing layer disposed between nitrogen-containing layers. In some embodiments, the nitrogen-containing layers may include silicon nitride (SiN) and the oxygen-containing layer may include silicon oxide (SiOx). In various examples, a thickness of each of the nitrogen-containing layers is greater than a thickness of the oxygen-containing layer. In some embodiments, the embedded stress-reduction feature may function as a crack stop, preventing cracks within the passivation layer from propagating to the MIM capacitors, and thus preventing the formation of cracks and/or other defects within conductor plates or dielectric layers of the MIM capacitors. Additional benefits and/or other advantages will become apparent to those skilled in the art having benefit of the present disclosure.

Thus, one of the embodiments of the present disclosure described a device including a substrate having one or more semiconductor devices. In some embodiments, the device further includes a first passivation layer disposed over the one or more semiconductor devices. The device may further include a metal-insulator-metal (MIM) capacitor structure formed over the first passivation layer. In addition, the device may further include a second passivation layer disposed over the MIM capacitor structure. In various examples, a stress-reduction feature is embedded within the second passivation layer.

In another of the embodiments, discussed is a device including a first passivation layer disposed over a substrate having an active semiconductor device. In some embodiments, the device further includes a metal-insulator-metal (MIM) structure formed over the first passivation layer. In various embodiments, the device also includes a stress-reduction feature formed over the MIM structure. The stress-reduction feature includes, in some embodiments, a first nitrogen-containing layer, an oxygen-containing layer disposed over the first nitrogen-containing layer, and a second nitrogen-containing layer disposed over the oxygen-containing layer.

In yet another of the embodiments, discussed is a method including depositing a first passivation layer over a substrate having one or more semiconductor devices. In some embodiments, the method further includes forming a metal-insulator-metal (MIM) capacitor over the first passivation layer. By way of example, the method further includes forming a second passivation layer over the MIM capacitor. In some embodiments, the forming the second passivation layer includes depositing a first dielectric portion of the second passivation layer over the MIM capacitor, forming a stress-reduction feature of the second passivation layer over the first dielectric portion, and depositing a second dielectric portion of the second passivation layer over the stress-reduction feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A device, comprising:
a substrate including one or more semiconductor devices;
a first passivation layer disposed over the one or more semiconductor devices;
a metal-insulator-metal (MIM) capacitor structure formed over the first passivation layer; and a second passivation layer disposed over the MIM capacitor structure, wherein a stress-reduction feature is embedded within the second passivation layer;

wherein the stress-reduction feature includes a first nitrogen-containing layer, an oxygen-containing layer disposed over the first nitrogen-containing layer, and a second nitrogen-containing layer disposed over the oxygen containing layer.

2. The device of claim 1, wherein the second passivation layer includes a first dielectric portion disposed beneath the stress-reduction feature and a second dielectric portion disposed above the stress-reduction feature.

3. The device of claim 2, wherein the stress-reduction feature has a greater mechanical strength than at least the second dielectric portion.

4. The device of claim 1, wherein the first nitrogen-containing layer and the second nitrogen-containing layer include silicon nitride (SiN), and wherein the oxygen-containing layer includes an oxide layer.

5. The device of claim 1, wherein the first nitrogen-containing layer has a first thickness, wherein the oxygen-containing layer has a second thickness, wherein the second nitrogen-containing layer has a third thickness, and wherein the second thickness is less than each of the first thickness and the third thickness.

6. The device of claim 1, further comprising:
a multi-layer interconnect (MLI) structure at least partially disposed within the substrate, wherein the first passivation layer is disposed over the MLI structure.

7. The device of claim 6, further comprising:
a contact feature disposed over the second passivation layer, wherein the contact feature is electrically coupled to the MLI structure.

8. The device of claim 7, wherein an upper portion of the contact feature includes a redistribution layer (RDL).

9. The device of claim 7, further comprising:
a third passivation layer disposed over the second passivation layer, wherein the contact feature is disposed within the third passivation layer.

10. The device of claim 1, wherein the stress-reduction feature includes a patterned stress-reduction feature that covers a first area greater than or equal to a second area covered by the MIM capacitor structure.

11. A device, comprising:
a first passivation layer disposed over a substrate including an active semiconductor device;
a metal-insulator-metal (MIM) structure formed over the first passivation layer; and
a stress-reduction feature formed over the MIM structure, wherein the stress-reduction feature includes a first nitrogen-containing layer having a first thickness, an oxygen-containing layer having a second thickness disposed over the first nitrogen-containing layer, and a second nitrogen-containing layer having a third thickness disposed over the oxygen-containing layer, wherein the second thickness is less than each of the first thickness and the third thickness.

12. The device of claim 11, further comprising a first dielectric portion disposed between the MIM structure and the stress-reduction feature and a second dielectric portion disposed above the stress-reduction feature.

13. The device of claim 12, wherein the first dielectric portion and the second dielectric portion provide a second passivation layer, and wherein the MIM structure is embedded within the second passivation layer.

14. The device of claim 12, wherein the stress-reduction feature has a greater mechanical strength than at least the second dielectric portion.

15. The device of claim 11, wherein the first nitrogen-containing layer and the second nitrogen-containing layer include silicon nitride (SiN), and wherein the oxygen-containing layer includes an oxide layer.

16. The device of claim 11, wherein the stress-reduction feature includes a patterned stress-reduction feature, and wherein the patterned stress-reduction feature is disposed in a region of the device including the MIM structure.

17. A device, comprising:
a substrate including a multi-layer interconnect (MLI) structure;
a metal-insulator-metal (MIM) capacitor disposed over the MLI structure;
a stress-reduction feature disposed over the MIM capacitor, wherein the stress-reduction feature includes a multi-layer structure having an oxygen-containing layer disposed between a first nitrogen-containing layer and a second nitrogen-containing layer;
a first passivation layer interposing the MLI structure and the MIM capacitor; and
a second passivation layer disposed over the MIM capacitor, wherein the stress-reduction feature is embedded within the second passivation layer.

18. The device of claim 17, further comprising:
a first contact feature and a second contact feature disposed over the second passivation layer, wherein the first contact feature provides electrical contact to a first terminal of the MIM capacitor, and wherein the second contact feature provides electrical contact to a second terminal of the MIM capacitor.

19. The device of claim 17, wherein a first area covered by the stress-reduction feature is greater than or equal to a second area covered by the MIM capacitor.

20. The device of claim 17, wherein the oxygen-containing layer is thinner than each of the first nitrogen-containing layer and the second nitrogen-containing layer.

* * * * *